(12) United States Patent
Takeuchi et al.

(10) Patent No.: US 10,432,237 B2
(45) Date of Patent: Oct. 1, 2019

(54) MULTIPLEXER

(71) Applicant: TAIYO YUDEN CO., LTD., Tokyo (JP)

(72) Inventors: Hirotaka Takeuchi, Tokyo (JP); Toshiyuki Saito, Tokyo (JP); Shinya Osakabe, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/151,020

(22) Filed: Oct. 3, 2018

(65) Prior Publication Data
US 2019/0123771 A1 Apr. 25, 2019

(30) Foreign Application Priority Data

Oct. 20, 2017 (JP) ................................. 2017-203950
Nov. 13, 2017 (JP) ................................. 2017-218289

(51) Int. Cl.

| H04B 1/44 | (2006.01) |
|---|---|
| H04B 1/00 | (2006.01) |
| H01L 23/532 | (2006.01) |
| H04J 1/04 | (2006.01) |
| H01L 23/66 | (2006.01) |

(52) U.S. Cl.
CPC ....... *H04B 1/0057* (2013.01); *H01L 23/5329* (2013.01); *H01L 23/66* (2013.01); *H04J 1/045* (2013.01)

(58) Field of Classification Search
CPC .... H04B 1/0057; H04B 1/0053; H04B 1/005; H04B 1/006; H01L 23/5329; H01L 23/66; H04J 1/045
See application file for complete search history.

(56) References Cited

U.S. PATENT DOCUMENTS

| 8,687,736 | B1 * | 4/2014 | Huynh | ................... | H03D 3/007 |
|---|---|---|---|---|---|
| | | | | | 375/322 |
| 2002/0096663 | A1 | 7/2002 | Sato et al. | ..................... | 252/500 |
| 2004/0116098 | A1 * | 6/2004 | Ochii | .................... | H03H 7/463 |
| | | | | | 455/333 |
| 2010/0091752 | A1 | 4/2010 | Kemmochi et al. | .......... | 370/339 |

(Continued)

FOREIGN PATENT DOCUMENTS

| JP | 8-153414 A | 6/1996 |
|---|---|---|
| JP | 2002-25337 A | 1/2002 |

(Continued)

*Primary Examiner* — Nhan T Le
(74) *Attorney, Agent, or Firm* — Stein IP, LLC

(57) ABSTRACT

A multiplexer includes: a low-pass filter that is connected between a common terminal and a first terminal and is formed of one or more first inductors and one or more first capacitors; a bandpass filter that is connected between the common terminal and a second terminal, has a passband higher than a passband of the low-pass filter, and is formed of one or more second inductors and one or more second capacitors; a high-pass filter that is connected between the common terminal and a third terminal, has a passband higher than the passband of the bandpass filter, and is formed of one or more third inductors and one or more third capacitors; and a fourth inductor that has a first end coupled to the common terminal and a second end coupled to the high-pass filter.

11 Claims, 25 Drawing Sheets

(56) References Cited

U.S. PATENT DOCUMENTS

| | | | | |
|---|---|---|---|---|
| 2012/0274417 A1* | 11/2012 | Kihara | ................... | H03H 7/38 |
| | | | | 333/133 |
| 2014/0232481 A1* | 8/2014 | Mizoguchi | ........... | H03H 7/0138 |
| | | | | 333/132 |
| 2015/0053475 A1 | 2/2015 | Kim | .............................. | 174/266 |

FOREIGN PATENT DOCUMENTS

| | | | |
|---|---|---|---|
| JP | 2004-55554 A | 2/2004 |
| JP | 2006-332980 A | 12/2006 |
| JP | 2007-129048 A | 5/2007 |
| JP | 2009-170848 A | 7/2009 |
| JP | 2011-091862 A | 5/2011 |
| JP | 2014-170874 A | 9/2014 |
| JP | 2015-41776 A | 3/2015 |
| JP | 2015-76457 A | 4/2015 |
| JP | 2015-76567 A | 4/2015 |
| JP | 2015-115866 A | 6/2015 |
| JP | 2017-59749 A | 3/2017 |

* cited by examiner

MULTIPLEXER

CROSS-REFERENCE TO RELATED APPLICATION

This application is based upon and claims the benefit of priority of the prior Japanese Patent Application No. 2017-218289, filed on Nov. 13, 2017, and the prior Japanese Patent Application No. 2017-203950, filed on Oct. 20, 2017, the entire contents of which are incorporated herein by reference.

FIELD

A certain aspect of the present invention relates to a multiplexer.

BACKGROUND

To increase the speed of wireless communication of smartphones and mobile phones, technology for simultaneously using a plurality of bands such as Carrier Aggregation has been used. Thus, a multiplexer is used. In the multiplexer, first ends of a plurality of low-pass filters (LPFs), bandpass filters (BPFs) and/or high-pass filters (HPFs) are commonly coupled to a common terminal as disclosed in, for example, Japanese Patent Application Publication Nos. 2015-115866, 2006-332980, and 2011-91862.

SUMMARY OF THE INVENTION

According to an aspect of the present invention, there is provided a multiplexer including: a low-pass filter that is connected between a common terminal and a first terminal and is formed of one or more first inductors and one or more first capacitors; a bandpass filter that is connected between the common terminal and a second terminal, has a passband higher than a passband of the low-pass filter, and is formed of one or more second inductors and one or more second capacitors; a high-pass filter that is connected between the common terminal and a third terminal, has a passband higher than the passband of the bandpass filter, and is formed of one or more third inductors and one or more third capacitors; and a fourth inductor that has a first end coupled to the common terminal and a second end coupled to the high-pass filter.

DETAILED DESCRIPTION

However, in the multiplexer including an LPF, a BPF, and an HPF, the attenuation characteristic of the HPF deteriorates.

First Comparative Example

Figure 1:
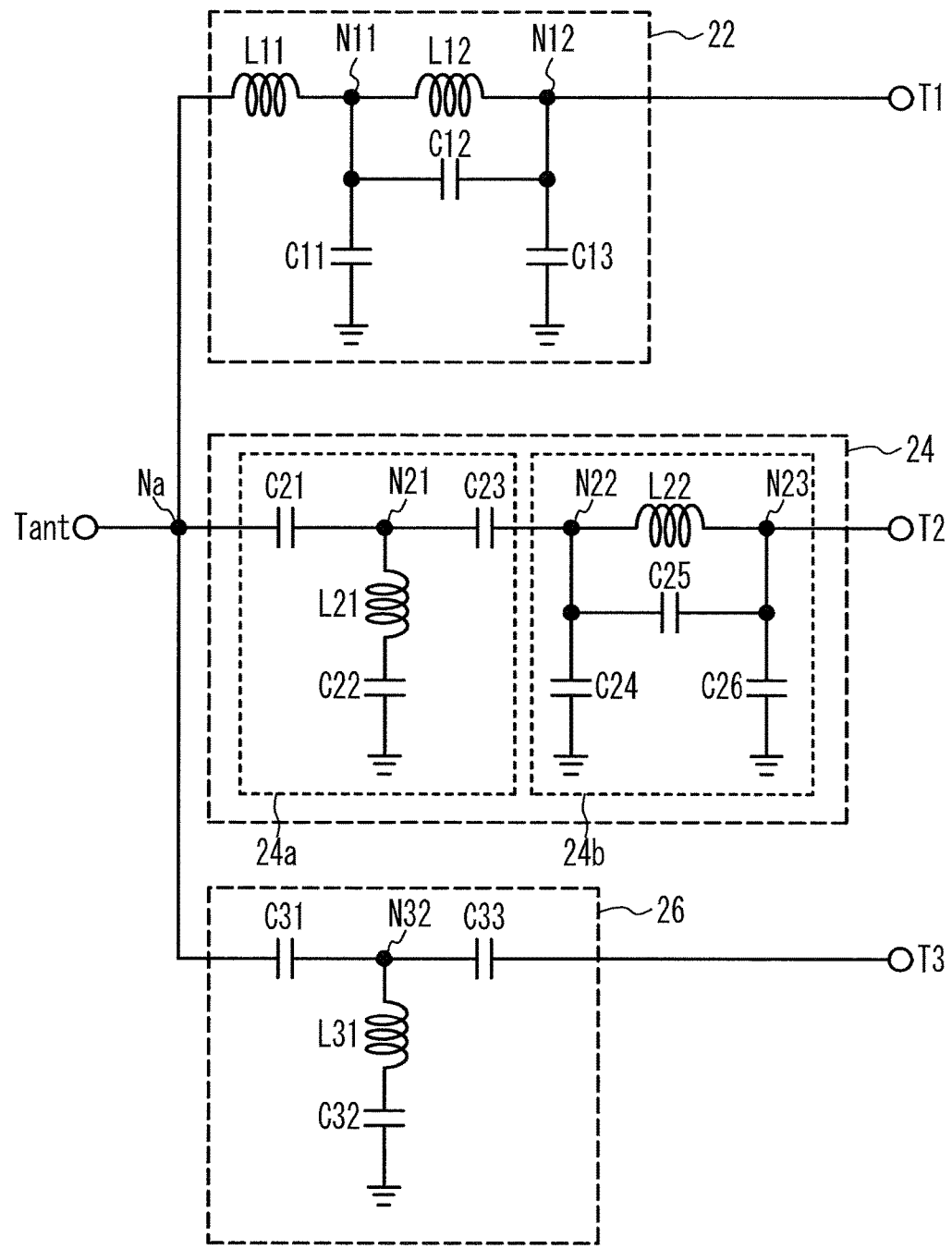
FIG. 1 is a circuit diagram of a multiplexer in accordance with a first comparative example.

FIG. 1 is a circuit diagram of a multiplexer in accordance with a first comparative example. As illustrated in FIG. 1, a low-pass filter (LPF) 22 is connected between a common terminal Tant and a terminal T1. A bandpass filter (BPF) 24 is connected between the common terminal Tant and a terminal T2. A high-pass filter (HPF) 26 is connected between the common terminal Tant and a terminal T3. The LPF 22, the BPF 24, and the HPF 26 are commonly connected to a common node Na. The passband of the BPF 24 is higher than the passband of the LPF 22, and the passband of the HPF 26 is higher than the passband of the BPF 24.

The LPF 22 outputs signals in the passband to the common terminal Tant (or the terminal T1) among high-frequency signals input to the terminal T1 (or the common terminal Tant), and suppresses signals in other frequency bands. The BPF 24 outputs signals in the passband to the common terminal Tant (or the terminal T2) among high-frequency signals input to the terminal T2 (or the common terminal Tant), and suppresses signals in other frequency bands. The HPF 26 outputs signals in the passband to the common terminal Tant (or the terminal T3) among high-frequency signals input to the terminal T3 (or the common terminal Tant), and suppresses signals in other frequency bands.

Each of the LPF 22, the BPF 24, and the HPF 26 is formed of one or more inductors and one or more capacitors. The LPF 22 includes inductors L11 and L12 and capacitors C11 through C13. The inductors L11 and L12 are connected in series between the common terminal Tant and the terminal T1. The capacitor C11 is connected between a node N11, which is between the inductors L11 and L12, and a ground. The capacitor C13 is connected between a node N12 closer to the terminal T1 of the inductor L12 and a ground. The capacitor C12 is connected in parallel to the inductor L12 between the nodes N11 and N12.

The BPF 24 includes an HPF 24a and an LPF 24b. The HPF 24a and the LPF 24b are connected in series between the common terminal Tant and the terminal T2. The HPF 24a includes an inductor L21 and capacitors C21 through C23. The LPF 24b includes an inductor L22 and capacitors C24 through C26. The capacitors C21 and C23 and the inductor L22 are connected in series between the common terminal Tant and the terminal T2. The inductor L21 and the capacitor C22 are connected in series between a node N21, which is between the capacitors C21 and C23, and a ground. The capacitor C24 is connected between a node N22, which is between the capacitor C23 and the inductor L22, and a ground. The capacitor C26 is connected between a node N23 closer to the terminal T2 of the inductor L22 and a ground. The capacitor C25 is connected in parallel to the inductor L22 between the nodes N22 and N23.

The HPF 26 includes an inductor L31 and capacitors C31 through C33. The capacitors C31 and C33 are connected in series between the common terminal Tant and the terminal T3. The inductor L31 and the capacitor C32 are connected in series between a node N32, which is between the capacitors C31 and C33, and a ground.

Transmission characteristics between the common terminal Tant and the terminals T1 through T3 in the first comparative example were simulated. Table 1 lists inductances and capacitances used for the simulation.

Figure 2:
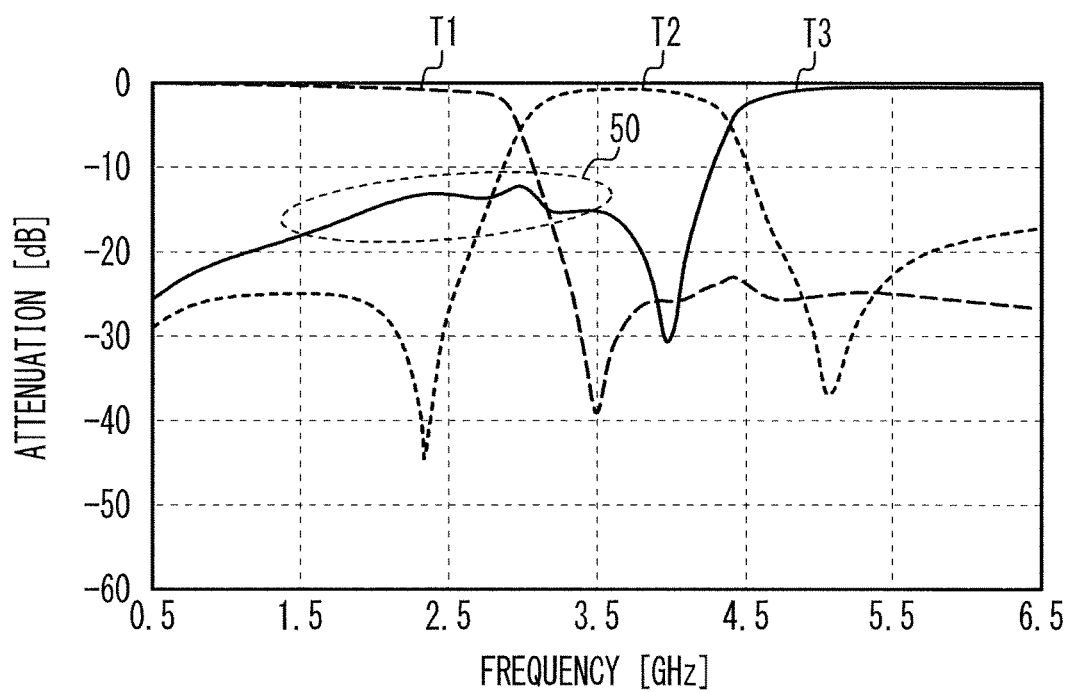
FIG. 2 illustrates the transmission characteristics of the multiplexer of the first comparative example.

FIG. 2 illustrates the transmission characteristics of the multiplexer of the first comparative example. T1 through T3 represent the transmission characteristics between the common terminal Tant and the terminals T1 through T3, respectively, and correspond to the transmission characteristics of the LPF 22, the BPF 24, and the HPF 26, respectively. As illustrated in FIG. 2, the passband of the LPF 22 is approximately 2.7 GHz or less. The passband of the BPF 24 is from approximately 3.1 GHz to 4.2 GHz. The passband of the HPF 26 is approximately 4.5 GHz or greater. The passbands of the LPF 22, the BPF 22, and the HPF 26 do not overlap with each other. As in a region 50, the attenuation characteristic of the HPF 26 from 1.5 GHz to 3.7 GHz deteriorates.

The reason why the attenuation characteristic of the HPF 26 deteriorates is because the capacitor C31 has a large capacitance. When the capacitance of the capacitor C31 is reduced, the attenuation characteristic in the region 50 improves. However, when the LPF 22, the BPF 24, and the HPF 26 are connected to the common terminal Tant, and impedance is matched so that the attenuation characteristic of the HPF 26 is improved in the passbands of other filters (the LPF 22 and the BPF 24), the capacitance of the capacitor C31 increases.

Second Comparative Example

Figure 3:
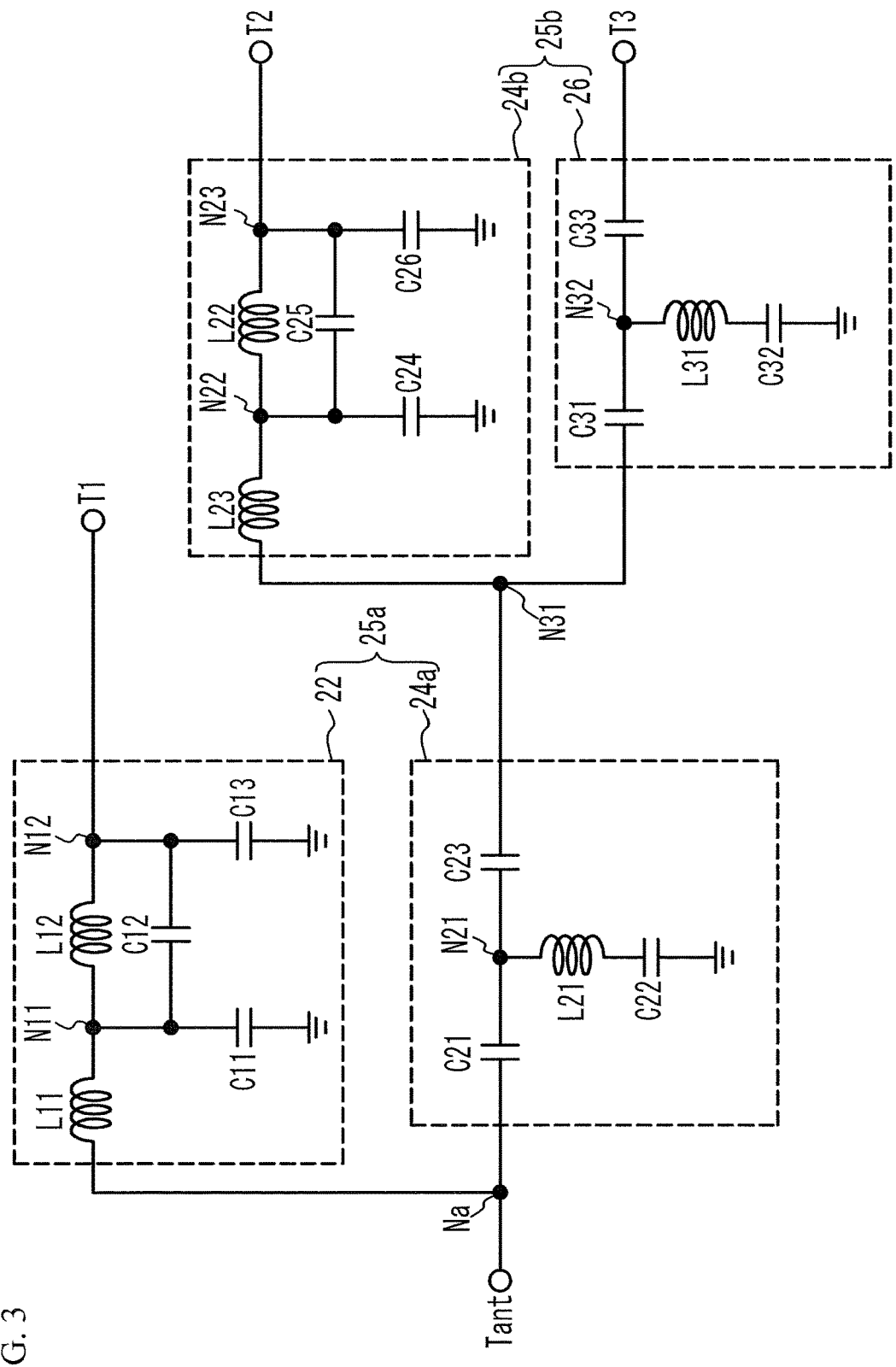
FIG. 3 is a circuit diagram of a multiplexer in accordance with a second comparative example.

FIG. 3 is a circuit diagram of a multiplexer in accordance with a second comparative example. As illustrated in FIG. 3, the LPF 24b and the HPF 26 are commonly connected to a node N31. The HPF 24a is connected between the node N31 and the common terminal Tant. The LPF 24b and the HPF 24a function as a BPF corresponding to the BPF 24 in FIG. 2. An inductor L23 is connected between the nodes N31 and N22. The multiplexer of the second comparative example includes a diplexer 25a including the LPF 22 and the HPF 24a and a diplexer 25b including the LPF 24b and the HPF 26. Other structures are the same as those of the first comparative example illustrated in FIG. 1, and the description thereof is thus omitted.

In the second comparative example, the HPF 24a is connected in series with the HPF 26 between the common terminal Tant and the terminal T3. Thus, the attenuation characteristic in the region 50 improves.

The transmission characteristics between the common terminal Tant and the terminals T1 through T3 in the second comparative example were simulated. Table 2 lists inductances and capacitances used for the simulation.

TABLE 1

|  | L11 | L12 | C11 | C12 | C13 |  |  |
|---|---|---|---|---|---|---|---|
| Inductance/Capacitance | 3.6 nH | 1.6 nH | 1.6 pF | 1.3 pF | 0.7 pF |  |  |
|  | L21 | L22 | C21 | C22 | C23 | C24 | C25 | C26 |
| Inductance/Capacitance | 3.3 nH | 0.9 nH | 0.8 pF | 1.4 pF | 1.1 pF | 0.7 pF | 1.1 pF | 0.8 pF |
|  | L31 |  | C31 | C32 | C33 |  |  |
| Inductance/Capacitance | 4 nH |  | 0.7 pF | 0.4 pF | 1.1 pF |  |  |

TABLE 2

|  | L11 | L12 | C11 | C12 | C13 |
|---|---|---|---|---|---|
| Inductance/Capacitance | 4 nH | 1.6 nH | 1.5 pF | 1.3 pF | 0.3 pF |

|  | L21 | L22 | L23 | C21 | C22 | C23 | C24 | C25 | C26 |
|---|---|---|---|---|---|---|---|---|---|
| Inductance/Capacitance | 2.9 nH | 0.85 nH | 3 nH | 0.7 pF | 1.8 pF | 0.8 pF | 1 pF | 1.2 pF | 0.01 pF |

|  | L31 | C31 | C32 | C33 |
|---|---|---|---|---|
| Inductance/Capacitance | 4 nH | 0.5 pF | 0.4 pF | 0.7 pF |

Figure 4:
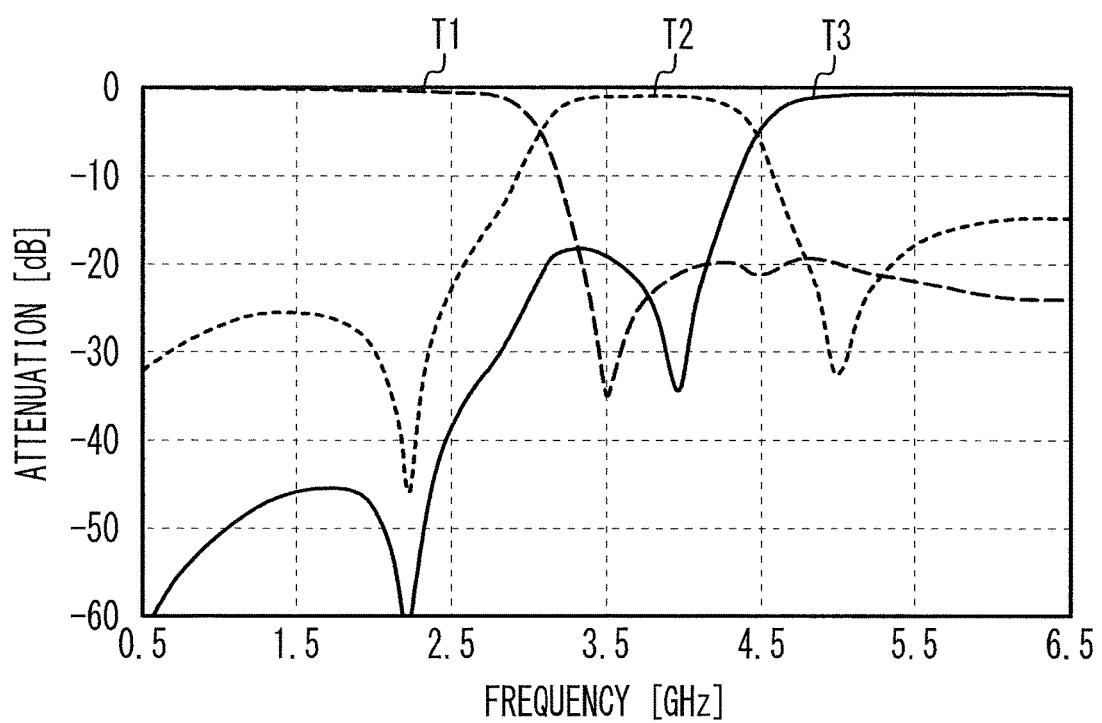
FIG. 4 illustrates the transmission characteristic of the multiplexer in accordance with the second comparative example.

FIG. 4 illustrates the transmission characteristic of the multiplexer in accordance with the second comparative example. T1 through T3 represent the transmission characteristics between the common terminal Tant and the terminals T1 through T3, respectively. As illustrated in FIG. 4, the attenuation characteristic between the common terminal Tant and the terminal T1 from 1.5 GHz to 3.5 GHz is improved from that of the first comparative example illustrated in FIG. 2.

Figure 5:
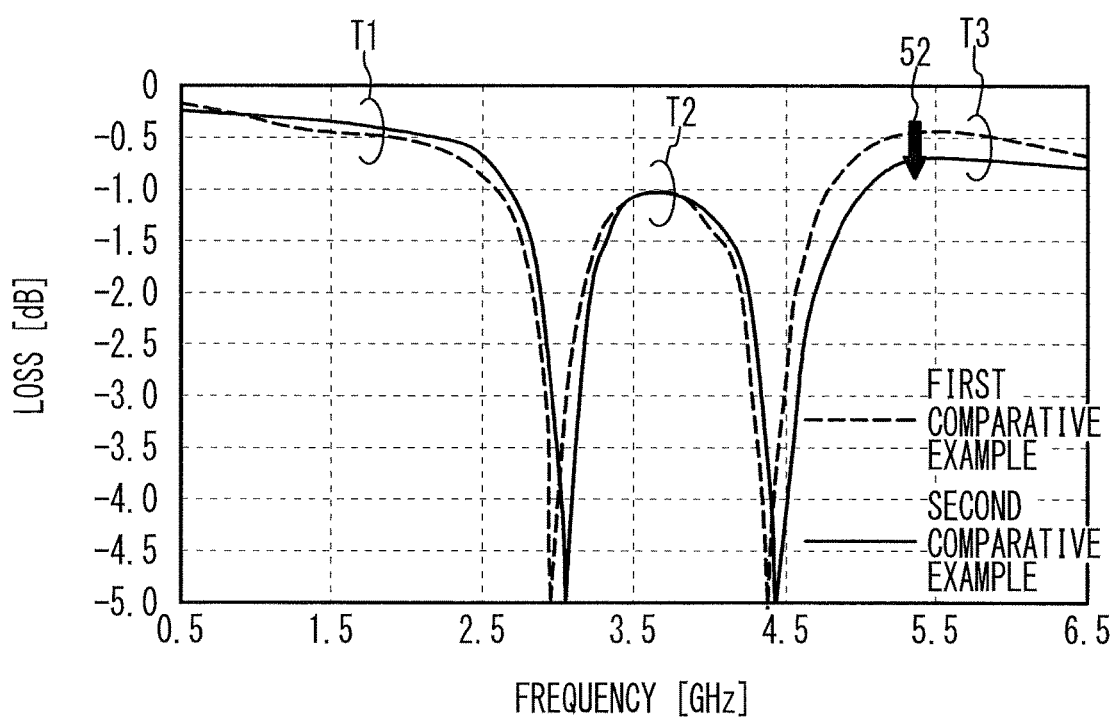
FIG. 5 illustrates loss in the passbands of the multiplexers of the first and second comparative examples.

FIG. 5 illustrates loss in the passbands of the multiplexers of the first and second comparative examples. The dashed line indicates the first comparative example, and the solid line indicates the second comparative example. As illustrated in FIG. 5, the loss between the common terminal Tant and the terminal T1 and the loss between the common terminal Tant and the terminal T2 are substantially the same between the first and second comparative examples. As indicated by an arrow 52, the loss between the common terminal Tant and the terminal T3 in the second comparative example is greater than that in the first comparative example.

Table 3 lists the loss between the common terminal Tant and the terminal T1 at 2690 MHz, the loss between the common terminal Tant and the terminal T2 at 3500 MHz, and the loss between the common terminal Tant and the terminal T3 at 5150 MHz in the first and second comparative examples.

TABLE 3

|  | T1 (2690 MHz) | T2 (3500 MHz) | T3 (5150 MHz) |
|---|---|---|---|
| First comparative example | 1.20 dB | 1.04 dB | 0.51 dB |
| Second comparative example | 0.98 dB | 1.04 dB | 0.83 dB |

As presented in table 3, the losses in the terminals T1 and T2 in the second comparative example are substantially the same as those in the first comparative example or are improved from those in the first comparative example. However, the loss between the common terminal Tant and the terminal T3 in the second comparative example increases from that in the first comparative example by approximately 0.32 dB.

As presented in FIG. 5 and table 3, the loss of the HPF increases in the second comparative example. This is because two HPFs 24a and 26 are connected in series between the common terminal Tant and the terminal T3.

First Embodiment

Figure 6:
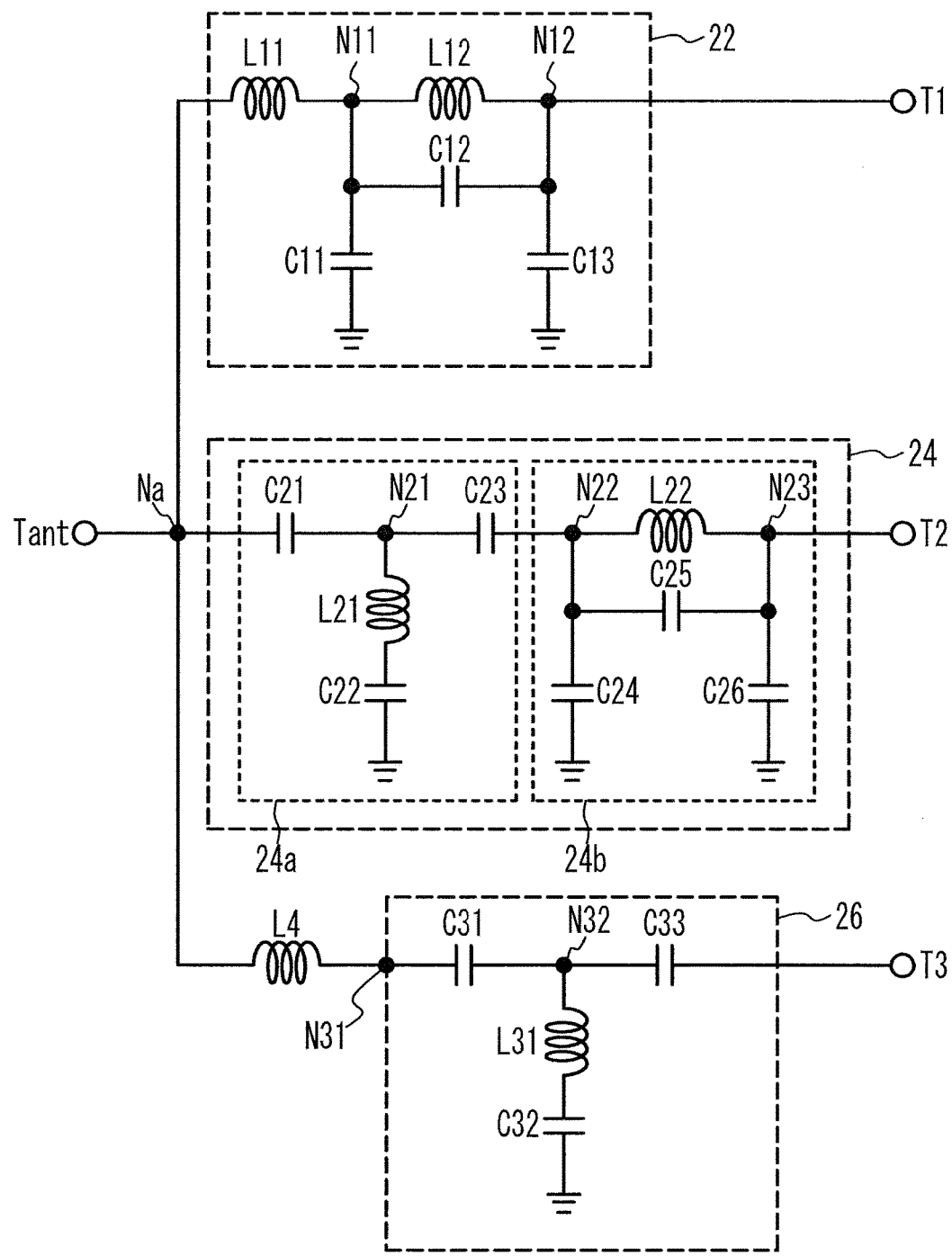
FIG. 6 is a circuit diagram of a multiplexer in accordance with a first embodiment.

FIG. 6 is a circuit diagram of a multiplexer in accordance with a first embodiment. As illustrated in FIG. 6, in the first embodiment, an inductor L4 is connected between a node N31 closer to the common terminal Tant of the HPF 26 and the node Na. Other structures are the same as those of the first comparative example illustrated in FIG. 1, and the description thereof is thus omitted.

The first embodiment provides the inductor L4. By setting the inductance of the inductor L4 at an appropriate value, the capacitance of the capacitor C31 can be made to be small even when the impedance is matched. Thus, the attenuation characteristic in the low band is improved.

The transmission characteristics between the common terminal Tant and the terminals T1 through T3 in the first embodiment were simulated. Table 4 lists inductances and capacitances used for the simulation.

TABLE 4

|  | L11 | L12 | C11 | C12 | C13 |
|---|---|---|---|---|---|
| Inductance/Capacitance | 3.6 nH | 1.6 nH | 1.9 pF | 1.3 pF | 0.7 pF |

|  | L21 | L22 | C21 | C22 | C23 | C24 | C25 | C26 |
|---|---|---|---|---|---|---|---|---|
| Inductance/Capacitance | 3.3 nH | 0.9 nH | 0.8 pF | 1.4 pF | 1.4 pF | 0.8 pF | 1.1 pF | 0.8 pF |

TABLE 4-continued

| | L31 | C31 | C32 | C33 |
|---|---|---|---|---|
| Inductance/Capacitance | 4.2 nH | 0.3 pF | 0.4 pF | 0.9 pF |

| | L4 |
|---|---|
| Inductance/Capacitance | 1.9 nH |

Figure 7:
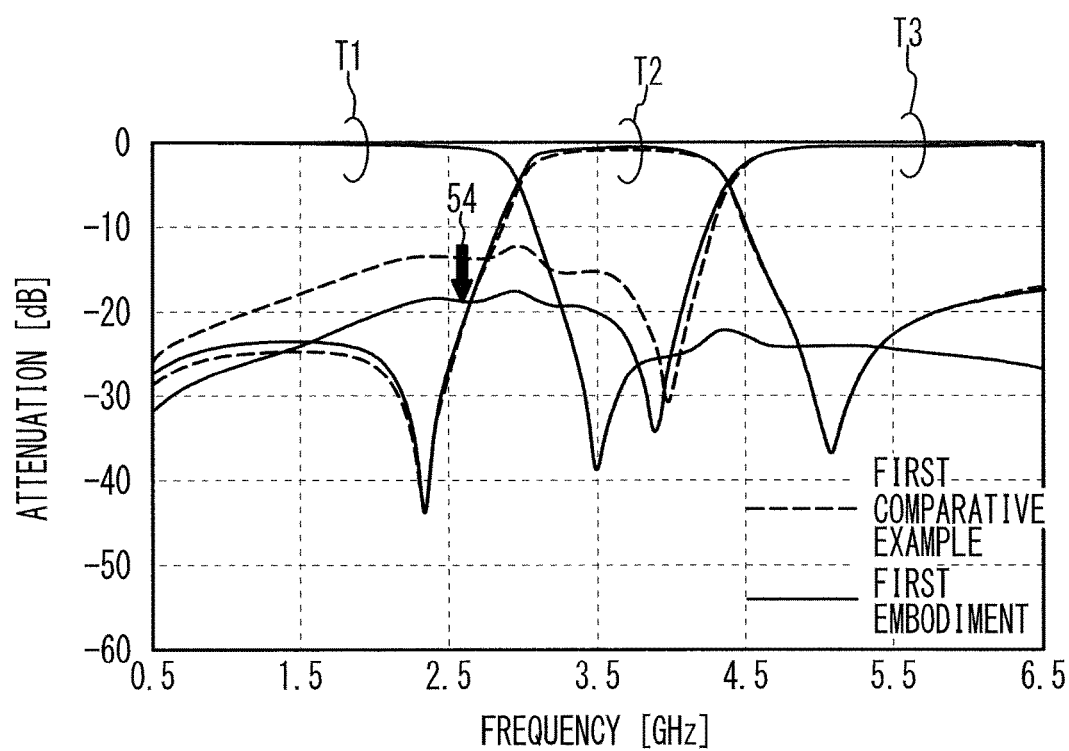
FIG. 7 illustrates the transmission characteristics of the multiplexers of the first comparative example and the first embodiment.

FIG. 7 illustrates the transmission characteristics of the multiplexers of the first comparative example and the first embodiment. T1 through T3 represent the transmission characteristics between the common terminal Tant and the terminals T1 through T3, respectively. The dashed line indicates the first comparative example, and the solid line indicates the first embodiment. As illustrated in FIG. 7, the attenuation characteristic between the common terminal Tant and the terminal T3 from 1.5 GHz to 3.7 GHz is improved from that of the first comparative example illustrated in FIG. 2. As indicated by an arrow 54, the attenuation at 2.6 GHz is −12.2 dB in the first comparative example, and is −17.5 dB in the first embodiment and is improved by 5.3 dB.

Figure 8:
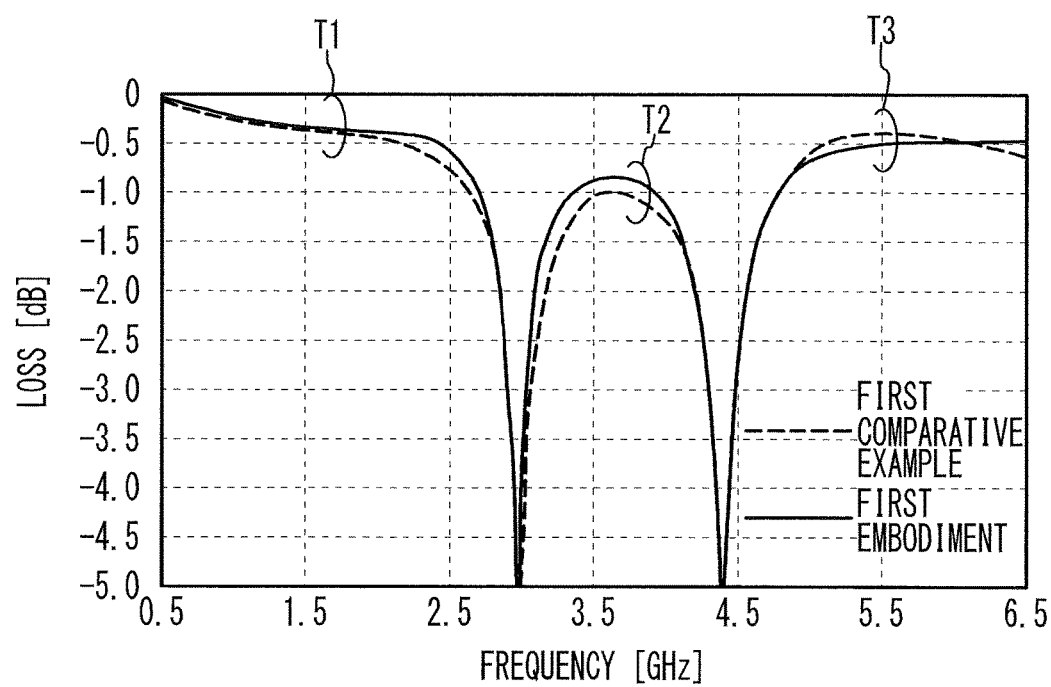
FIG. 8 illustrates loss in the passbands of the multiplexers in accordance with the first comparative example and the first embodiment.

FIG. 8 illustrates loss in the passbands of the multiplexers in accordance with the first comparative example and the first embodiment. The dashed line indicates the first comparative example, and the solid line indicates the first embodiment. As illustrated in FIG. 8, the loss between the common terminal Tant and the terminal T1, the loss between the common terminal Tant and the terminal T2, and the loss between the common terminal Tant and the terminal T3 in the first embodiment are approximately the same as those in the first comparative example.

Table 5 lists the loss between the common terminal Tant and the terminal T1 at 2690 MHz, the loss between the common terminal Tant and the terminal T2 at 3500 MHz, and the loss between the common terminal Tant and the terminal T3 at 5150 MHz in the first comparative example and the first embodiment.

TABLE 5

| | T1 (2690 MHz) | T2 (3500 MHz) | T3 (5150 MHz) |
|---|---|---|---|
| First comparative example | 1.20 dB | 1.04 dB | 0.51 dB |
| First embodiment | 1.06 dB | 0.96 dB | 0.62 dB |

As presented in table 5, the losses in the terminals T1 and T2 in the first embodiment slightly decrease from those in the first comparative example. The loss between the common terminal Tant and the terminal T3 in the first embodiment increases from that in the first comparative example by 0.11 dB, but 0.11 dB is less than the deterioration in loss in the second comparative example (0.32 dB) of table 3.

As illustrated in FIG. 7, in the first embodiment, deterioration in the attenuation characteristic of the HPF 26 in the low-frequency region is reduced compared to that in the first comparative example. Furthermore, as presented in FIG. 8 and table 5, compared to the second comparative example, the deterioration in loss of the HPF 26 is reduced. This is because the provision of the inductor L4 enables to match impedance even when the capacitance of the capacitor C31 is made to be small. By reducing the capacitance of the capacitor C31, the impedance in the low-frequency region increases, and the attenuation characteristic in the low-frequency region improves.

FIG. 9 through FIG. 12 are exploded perspective views of the multiplexer in accordance with the first embodiment. As illustrated in FIG. 9 through FIG. 12, a multilayered body 10 includes dielectric layers 11a through 11j that are stacked. Conductor patterns 12a through 12j are formed on the upper surfaces of the dielectric layers 11a through 11j, respectively. Terminals 14 are located on the lower surface of the dielectric layer 11j. The inductor is formed of at least one of the conductor patterns 12a through 12j. The capacitor is formed of the conductor patterns 12a through 12j sandwiching one or more dielectric layers 11b through 11i.

Via wirings 13 penetrating through the dielectric layers 11b through 11j are provided. The connection of the via wiring 13 is indicated by a dashed line. A black circle indicates that the via wiring 13 penetrates through the dielectric layer in which the black circle is illustrated. An open circle indicates that the via wiring 13 penetrates through the dielectric layer one-layer above the dielectric layer in which the open circle is illustrated, but does not penetrate through the dielectric layer in which the open circle is illustrated. A reference symbol located at the end of a dashed line arrow indicates the element in other diagrams to which the via wiring 13 is connected. For example, the reference symbol L4a at the end of a dashed line arrow in FIG. 9 indicates that the via wiring 13 is connected to a part L4a of the inductor L4 in FIG. 10.

Figure 9:
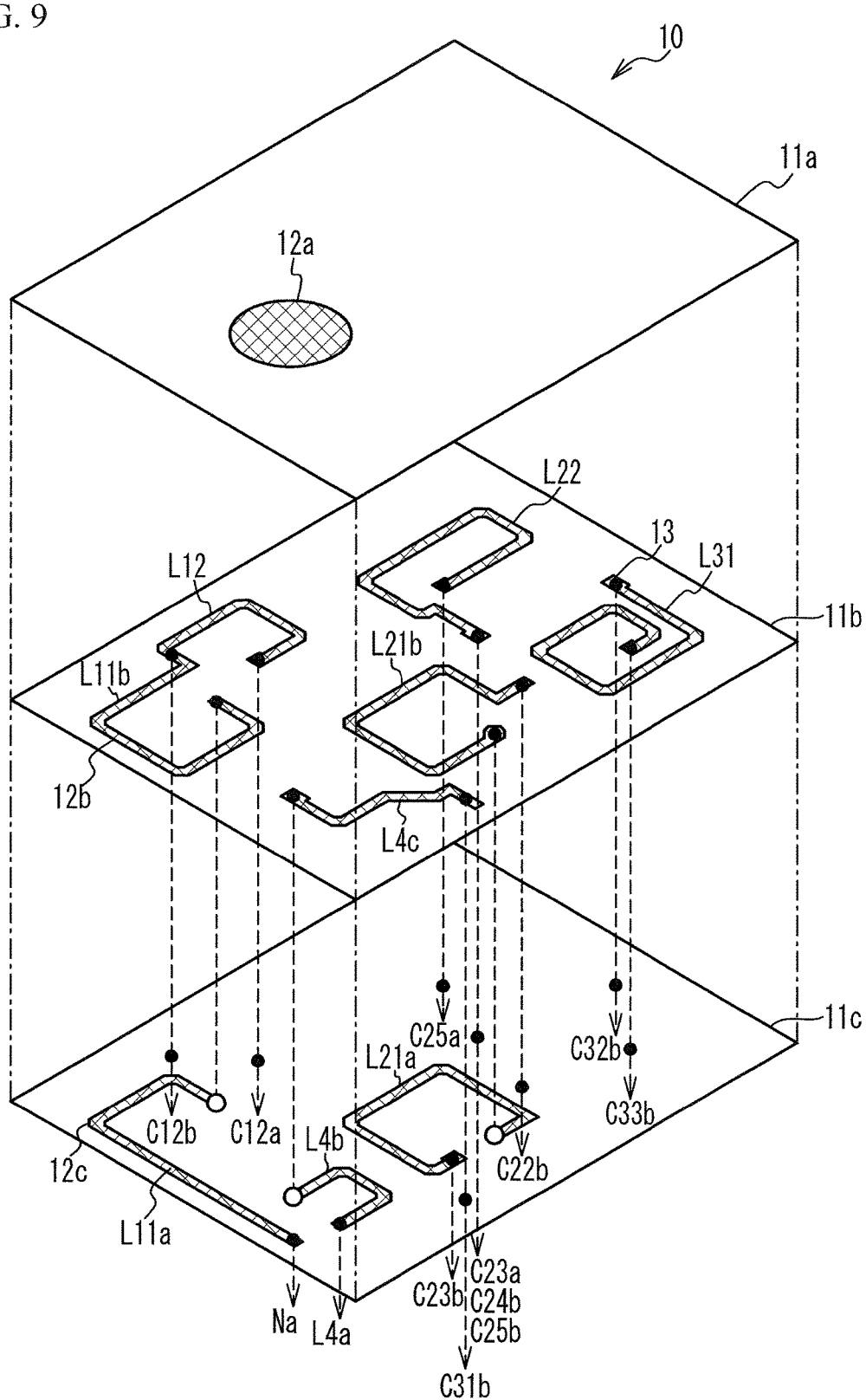
FIG. 9 is an exploded perspective view of the multiplexer in accordance with the first embodiment.

As illustrated in FIG. 9, the conductor pattern 12a functions as an orientation identification mark. A part L11b of the inductor L11, the inductor L12, a part L21b of the inductor L21, the inductor L22, the inductor L31, and a part L4c of the inductor L4 are formed of the conductor pattern 12b. A part L11a of the inductor L11, a part L21a of the inductor L21, and a part L4b of the inductor L4 are formed of the conductor patterns 12c.

Figure 10:
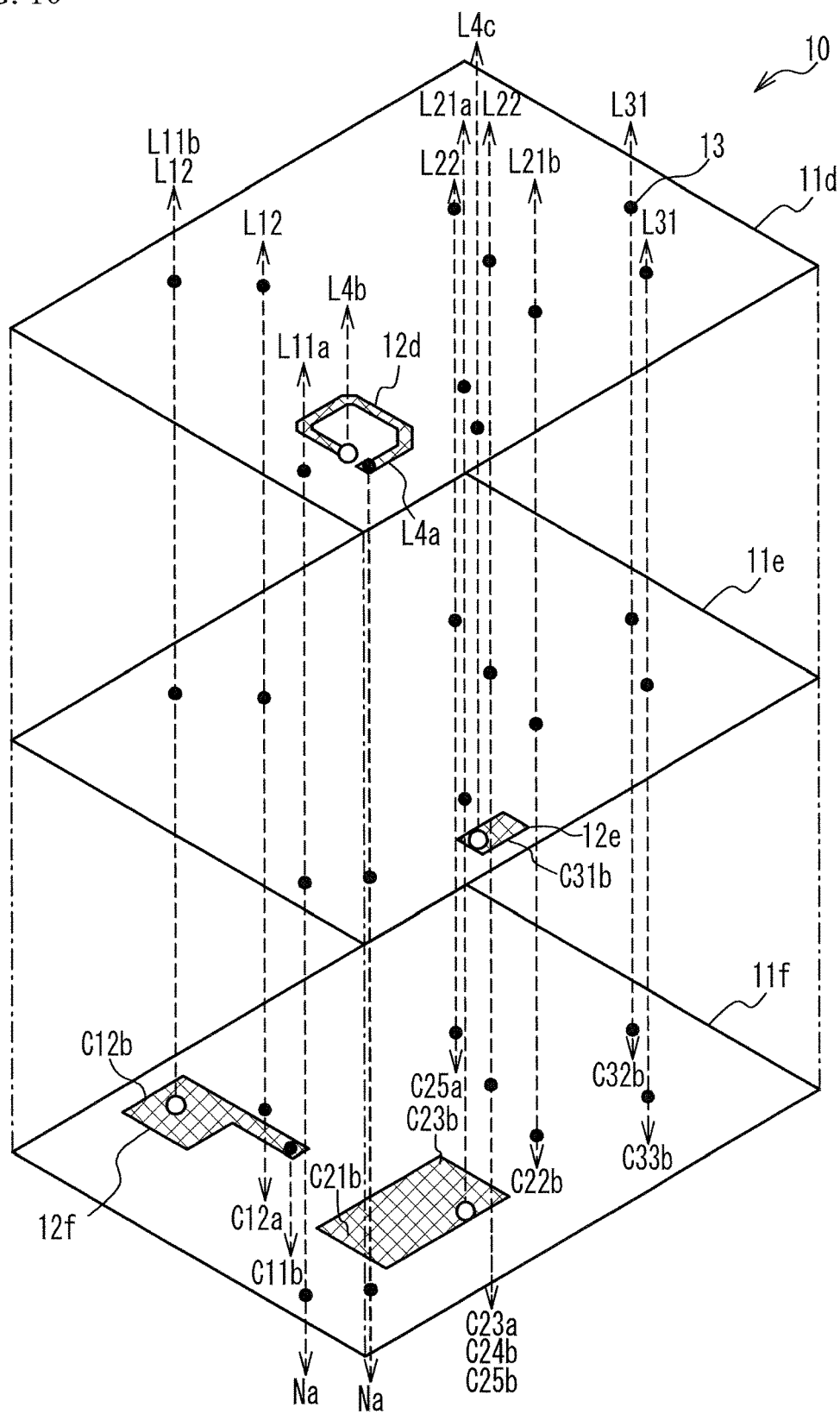
FIG. 10 is an exploded perspective view of the multiplexer in accordance with the first embodiment.

As illustrated in FIG. 10, a part L4a of the inductor L4 is formed of the conductor pattern 12d. A first electrode C31b of the capacitor C31 is formed of the conductor pattern 12e. A first electrode C12b of the capacitor C12, a first electrode C21b of the capacitor C21, and a first electrode C23b of the capacitor C23 are formed of the conductor pattern 12f.

Figure 11:
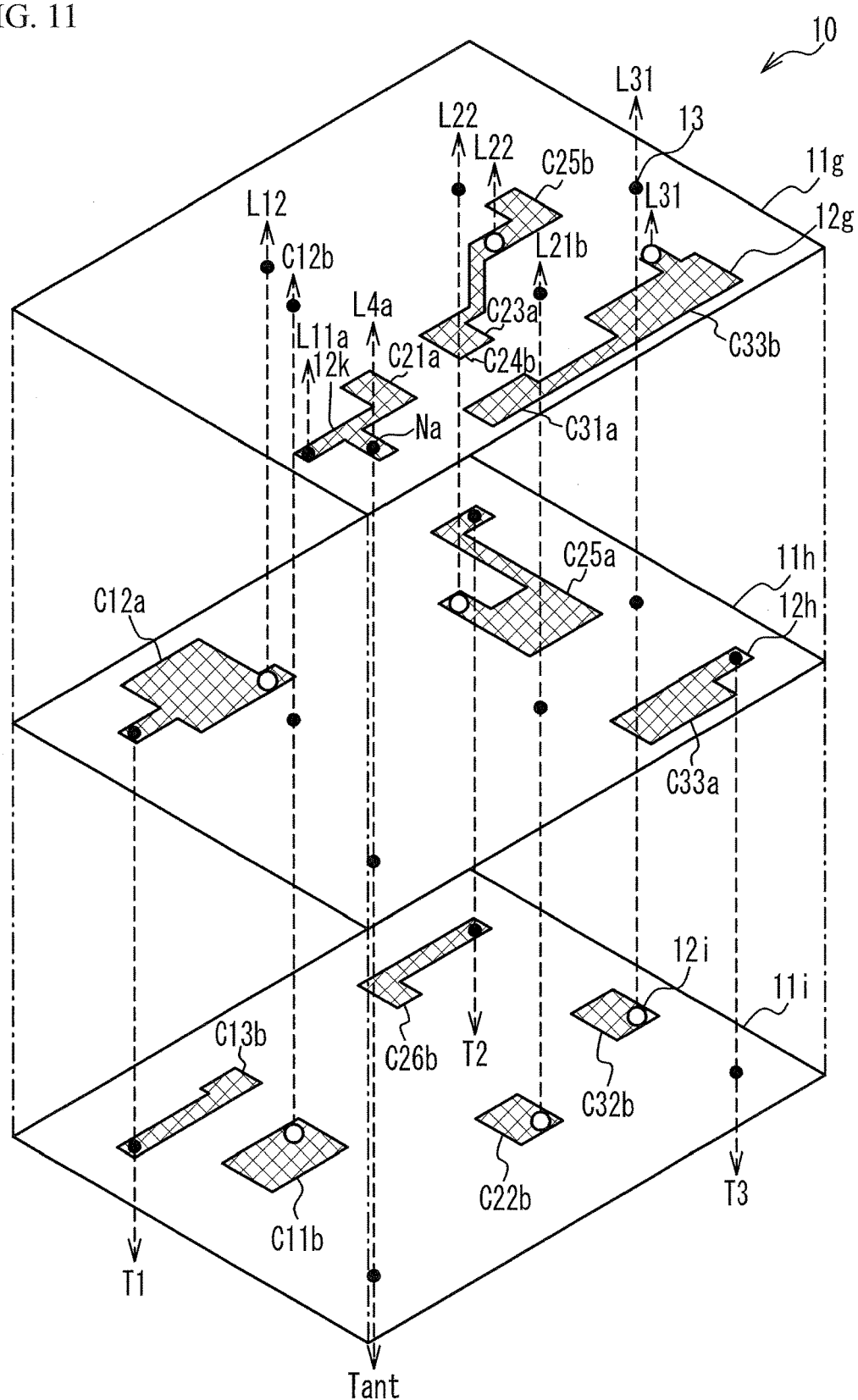
FIG. 11 is an exploded perspective view of the multiplexer in accordance with the first embodiment.

As illustrated in FIG. 11, a second electrode C21a of the capacitor C21, a second electrode C23a of the capacitor C23, a first electrode C24b of the capacitor C24, a first electrode C25b of the capacitor C25, a second electrode C31a of the capacitor C31, and a first electrode C33b of the capacitor C33 are formed of the conductor pattern 12g. The node Na, to which the LPF 22, the BPF 24, and the HPF 26 are commonly connected, is located in a conductor pattern 12k of the conductor pattern 12g.

A second electrode C12a of the capacitor C12, a second electrode C25a of the capacitor C25, and a second electrode C33a of the capacitor C33 are formed of the conductor pattern 12h. A first electrode C11b of the capacitor C11, a first electrode C13b of the capacitor C13, a first electrode C22b of the capacitor C22, a first electrode C26b of the capacitor C26, and a first electrode C32b of the capacitor C32 are formed of the conductor pattern 12i.

Figure 12:
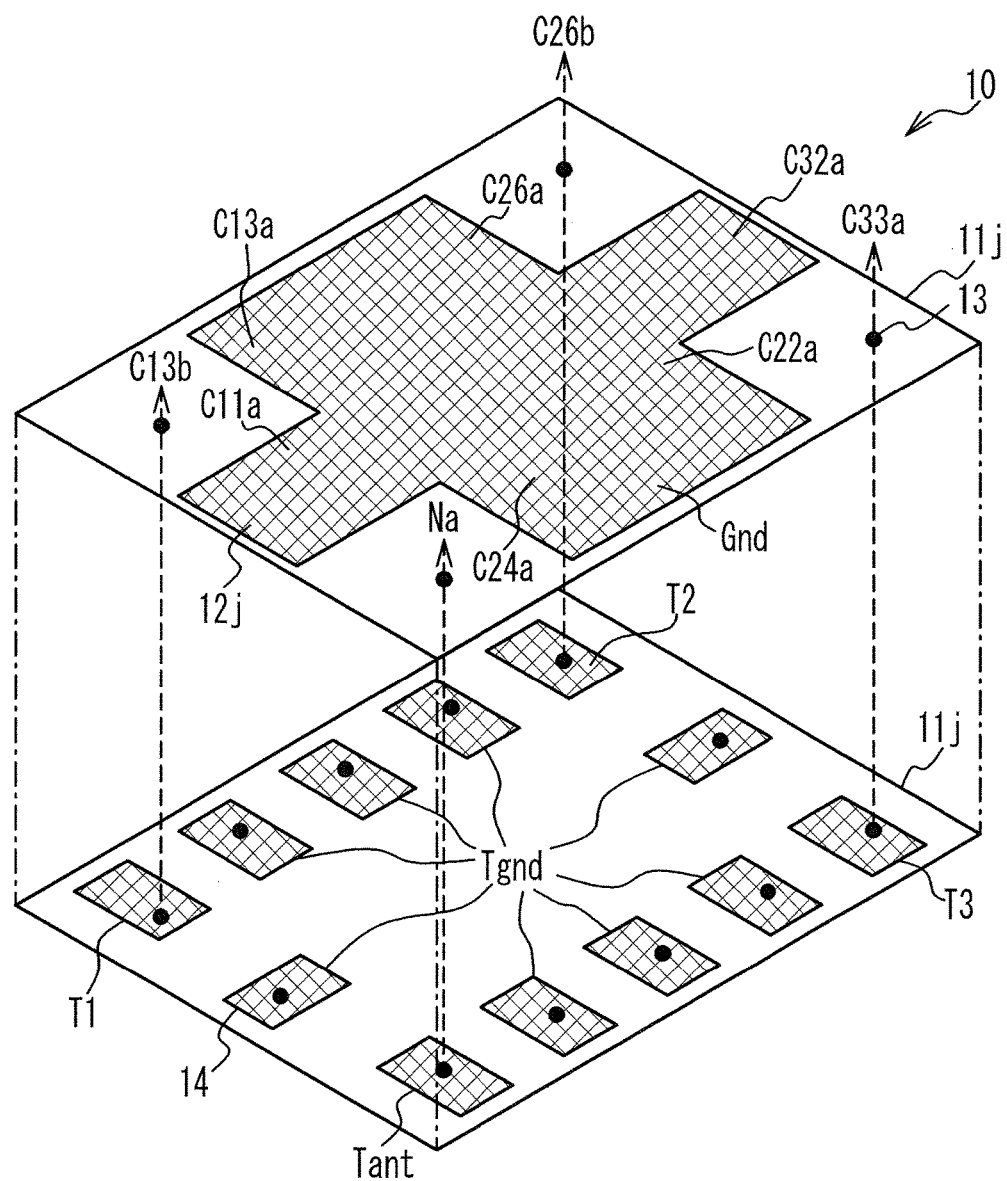
FIG. 12 is an exploded perspective view of the multiplexer in accordance with the first embodiment.

As illustrated in FIG. 12, a ground pattern Gnd is formed of the conductor pattern 12j. The ground pattern also serves as the second electrodes C11a, C13a, C22a, C24a, C26a, and C32a of the capacitors C11, C13, C22, C24, C26, and C32. The terminals 14 located on the lower surface of the dielectric layer 11j include the common terminal Tant, the terminals T1 through T3, and ground terminals Tgnd. The ground terminal Tgnd is electrically connected to the ground pattern Gnd through the via wiring 13.

The dielectric layers 11a through 11j are made of, for example, ceramic materials, and contain, for example, an oxide of Si, Ca, and Mg (for example, diopside $CaMgSi_2O_6$) as a main component. The conductor patterns 12a through 12j and the via wirings 13 are formed of metal layers containing, for example, Ag, Pd, Pt, Cu, Ni, Au, Au—Pd alloy, or Ag—Pt alloy. The terminal 14 has a metal layer made of the same material as the conductor patterns 12a through 12j and a plated layer located under the metal layer. The plated layer is formed of, for example, a Ni film and a Sn film. The Sn film is a solder layer for mounting the multiplexer on a motherboard, and the Ni film is a barrier layer for reducing interdiffusion between the solder layer and the conductor pattern.

In the first embodiment, the LPF 22 is connected between the common terminal Tant and the terminal T1 (a first terminal), and is formed of one or more inductors (first inductors) and one or more capacitors (first capacitors). The BPF 24 is connected between the common terminal Tant and the terminal T2 (a second terminal), has a passband higher than the passband of the LPF 22, and is formed of one or more inductors (second inductors) and one or more capacitors (second capacitors). The HPF 26 is connected between the common terminal Tant and the terminal T3 (a third terminal), has a passband higher than the passband of the BPF 24, and is formed of one or more inductors (third inductors) and one or more capacitors (third capacitors).

In such a multiplexer, impedance matching deteriorates the attenuation characteristic of the HPF 26 as illustrated in FIG. 2 of the first comparative example. Thus, provided is the inductor L4 (a fourth inductor) having a first end coupled to the common terminal Tant and a second end coupled to the HPF 26. This structure improves the attenuation characteristic of the HPF 26 as illustrated in FIG. 7. In addition, compared to the second comparative example, the loss of the HPF 26 is reduced as illustrated in FIG. 8.

The inductor or capacitor closest to the inductor L4 in terms of electrical connection in the HPF 26 is the capacitor C31 (a fourth capacitor) connected in series between the common terminal Tant and the terminal T3.

That is, the capacitors in the HPF 26 include the capacitor C31 (the fourth capacitor) that is connected to the inductor L4 without the remaining elements (i.e., the capacitor and the inductor) and is connected in series between the common terminal Tant and the terminal T3.

As described above, when the element closest to the common terminal Tant of the HPF 26 is the capacitor C31, the capacitance of the capacitor C31 is increased when impedance matching is attempted as in the first comparative example. A large capacitance of the capacitor C31 deteriorates the attenuation characteristic at low frequencies. Thus, as in the first embodiment, the provision of the inductor L4 reduces the deterioration in attenuation characteristic of the HPF 26.

Furthermore, in the HPF 26, the inductor or capacitor second-closest to the inductor L4 in terms of electrical connection is the inductor L31 (a fifth inductor) that is shunt-connected between the common terminal Tant and the terminal T3. The inductor or capacitor third-closest to the inductor L4 in terms of electrical connection is the capacitor C33 (a fifth capacitor) connected in series between the common terminal Tant and the terminal T3.

That is, the inductors in the HPF 26 include the inductor L31 (the fifth inductor) that is connected to the capacitor C31 without the remaining elements, and is shunt-connected between the common terminal Tant and the terminal T3. Additionally, the capacitors in the HPF 26 include the capacitor C33 (the fifth capacitor) that is connected to the capacitor C31 and the inductor L31 without the remaining elements and is connected in series between the common terminal Tant and the terminal T3.

As described above, the use of a T-type C-L-C filter for the HPF 26 easily deteriorates the attenuation characteristic. Thus, the provision of the inductor L4 reduces the deterioration in attenuation characteristic.

The capacitance of the capacitor C31 is equal to or less than a half of the capacitance of the capacitor C33. This configuration further reduces the deterioration in attenuation characteristic. The capacitance of the capacitor C31 is preferably equal to or a one-third of the capacitance of the capacitor C33.

In the case where the LPF and the HPF are connected to the common terminal Tant as in the diplexer, when the initial stage of the LPF is an inductor and the initial stage of the HPF is a capacitor, impedance matching between the LPF and the HPF is easy.

However, the inductor or capacitor closest to the common terminal Tant in terms of electrical connection in the LPF 22 is the inductor L11 (a sixth inductor) connected in series between the common terminal Tant and the terminal T1. The inductor or capacitor closest to the common terminal Tant in terms of electrical connection in the BPF 24 is the capacitor C21 (a sixth capacitor) connected in series between the common terminal Tant and the terminal T2.

That is, the inductors of the LPF 22 include the inductor L11 (the sixth inductor) that is connected to the common terminal Tant without the remaining elements (i.e., the inductor and the capacitor) and is connected in series between the common terminal Tant and the terminal T1. The capacitors of the BPF 24 include the capacitor C21 (the sixth capacitor) that is connected to the common terminal Tant without the remaining elements (i.e., the inductor and the capacitor) and is connected in series between the common terminal Tant and the terminal T2.

As described above, when the initial stage of the LPF 22 (i.e., the element closest to the common terminal Tant) is the inductor L11, the initial stage of the BPF 24 is the capacitor C21, and the initial stage of the HPF 26 is the capacitor C31, the number of filters having the capacitor at the first stage is two. Thus, it is difficult to match three filters. Thus, the inductor L4 is preferably provided as in the first embodiment.

The multiplexer includes the dielectric layers 11a through 11j, the conductor patterns 12a through 12j each being formed on the surface of one of the dielectric layers 11a through 11j, and the via wirings 13 each penetrating through at least one of the dielectric layers 11a through 11j and electrically connecting to at least one of the conductor patterns 12a through 12j. Each of the inductors and the capacitors of the LPF 22, the BPF 24, and the HPF 26 includes at least a part of at least one of the conductor patterns. As described above, the multiplexer can be formed by stacking dielectric layers.

Figure 13:
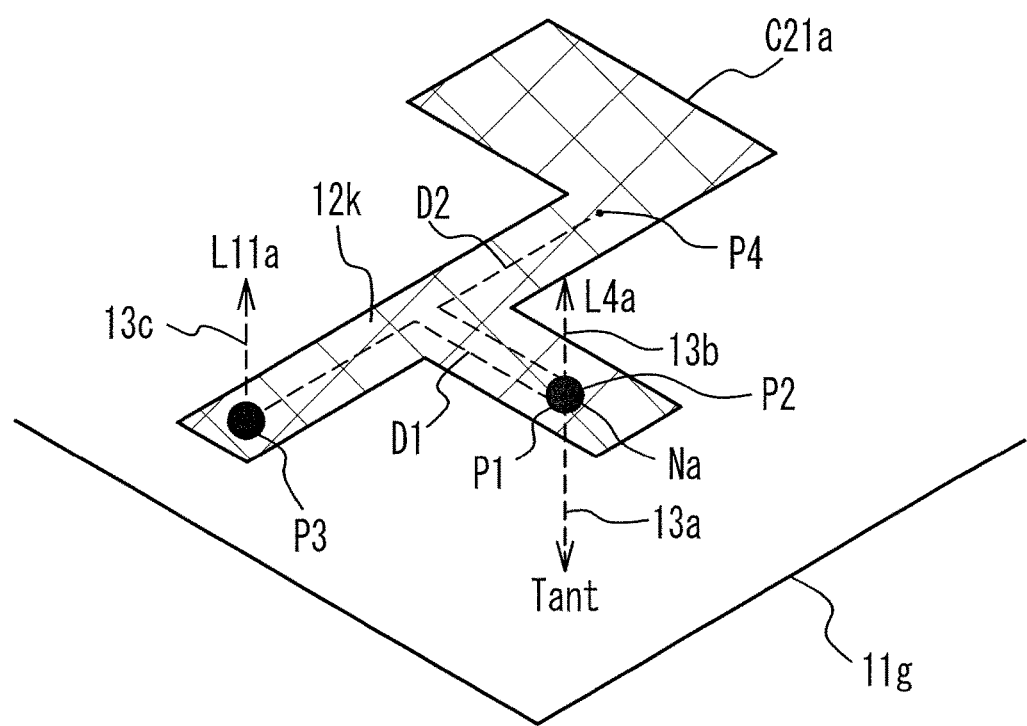
FIG. 13 is an enlarged view of a conductor pattern 12k in the first embodiment.

FIG. 13 is an enlarged view of the conductor pattern 12k in the first embodiment. As illustrated in FIG. 13, the conductor pattern 12k is located on the surface of the dielectric layer 11g. The conductor pattern 12k includes the node Na to which the LPF 22, the BPF 24, and the inductor L4 are commonly connected. A via wiring 13a connecting the common terminal Tant and the conductor pattern 12k is connected to the conductor pattern 12k in the position P1. A via wiring 13b electrically connecting the inductor L4 and the conductor pattern 12k is electrically connected to the conductor pattern 12k in the position P2. A via wiring 13c electrically connecting the inductor L11 of the LPF 22 and the conductor pattern 12k is electrically connected to the conductor pattern 12k in the position P3. The second electrode C21a of the capacitor C21 of the BPF 24 is integrally formed with the conductor pattern 12k, and is connected to the conductor pattern 12k in the position P4.

The positions P1 and P2 are substantially identical positions in the conductor pattern 12k, and the positions P1 and P2 correspond to the node Na. Accordingly, the length of the conductor pattern 12k electrically connecting the inductor L4 and the common terminal Tant is approximately 0. On the other hand, the length of the conductor pattern 12k electrically connecting the LPF 22 and the common terminal Tant corresponds to the length D1 between the positions P1 and P3, and the length of the conductor pattern 12k electrically connecting the BPF 24 and the common terminal Tant corresponds to the length D2 between the positions P1 and P4. As described above, the length of the conductor pattern 12k connecting the inductor L4 and the common terminal Tant is less than the length of the conductor pattern 12k electrically connecting the LPF 22 and the common terminal Tant and the length of the conductor pattern 12k electrically connecting the BPF 24 and the common terminal Tant.

Accordingly, the parasitic capacitance added between the inductor L4 and the common terminal Tant is decreased, and thus, impedance matching becomes easy.

As illustrated in FIG. 9 and FIG. 10, the inductor L4 includes at least two conductor patterns 12b through 12d respectively located on the surfaces of at least two dielectric layers 11b through 11d. The conductor patterns of the parts L4b and L4c of the inductor L4 at least partly overlap with each other in the stacking direction of the dielectric layers 11a through 11j to form a spiral pattern. Thus, the inductor L4 having a large inductance can be formed with use of the conductor patterns 12b through 12d.

The first embodiment has described a case where the multiplexer is formed in the multilayered body 10 formed by stacking the dielectric layers 11a through 11j, but the multiplexer may be formed in other than the multilayered body 10. The number of the dielectric layers 11a through 11j can be freely selected.

Second Embodiment

Figure 14:
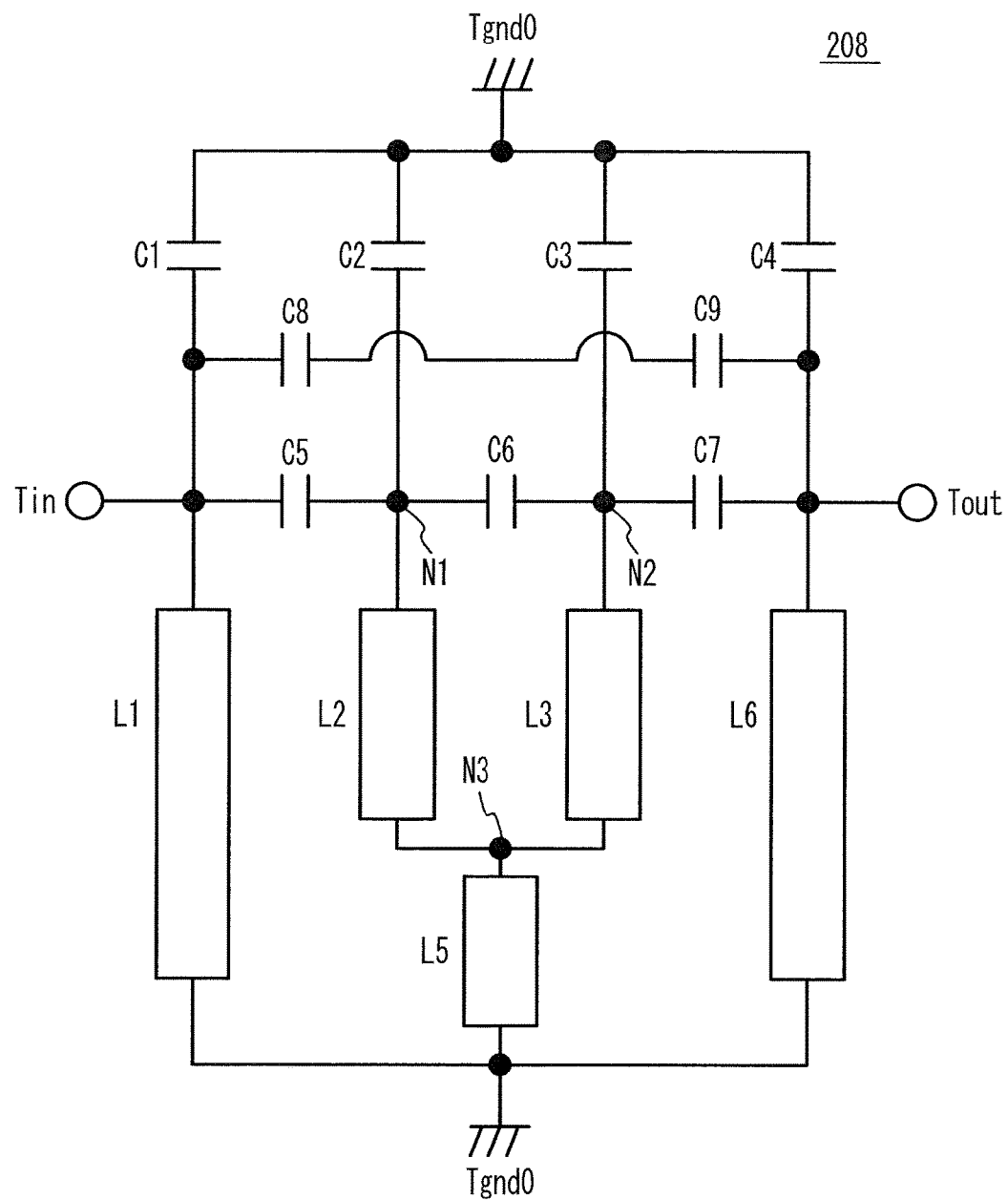
FIG. 14 is a circuit diagram of an electronic component in accordance with a second embodiment.

For a second embodiment, a description will be given of a bandpass filter (BPF) as an example. FIG. 14 is a circuit diagram of an electronic component in accordance with the second embodiment. As illustrated in FIG. 14, a BPF 208 includes an input terminal Tin, an output terminal Tout, ground terminals Tgnd0, capacitors C1 through C9, and striplines L1 through L5. The capacitors C5 through C7 are connected in series between the input terminal Tin and the output terminal Tout.

The capacitors C8 and C9 are connected in series between the input terminal Tin and the output terminal Tout, and are connected in parallel to the capacitors C5 through C7. The capacitor C1 is connected between the input terminal Tin and the ground terminal Tgnd0, the capacitor C2 is connected between a node N1 and the ground terminal Tgnd0, the capacitor C3 is connected between a node N2 and the ground terminal Tgnd0, and the capacitor C4 is connected between the output terminal Tout and the ground terminal Tgnd0. The stripline L1 is connected between the input terminal Tin and the ground terminal Tgnd0, and the stripline L6 is connected between the output terminal Tout and the ground terminal Tgnd0. The stripline L2 is connected between the node N1 and a node N3, and the stripline L3 is connected between the node N2 and the node N3. The stripline L5 is connected between the node N3 and the ground terminal Tgnd0.

The BPF 208 transmits signals in the passband to the output terminal Tout among high-frequency signals input to the input terminal Tin, and suppresses signals in other frequency bands.

Figure 15:
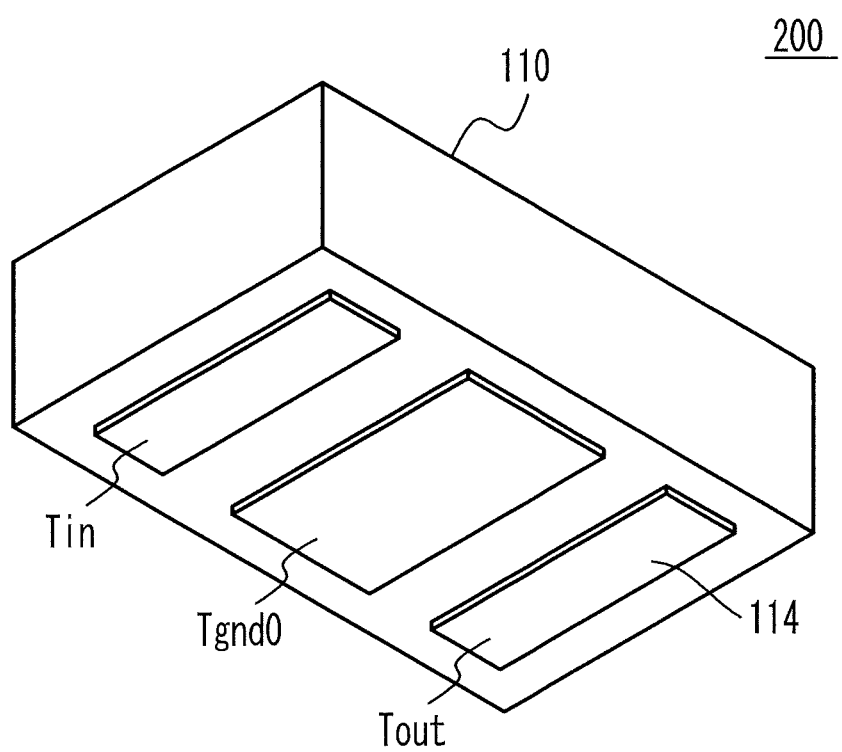
FIG. 15 is a perspective view of the electronic component in accordance with the second embodiment.
Figure 16A:
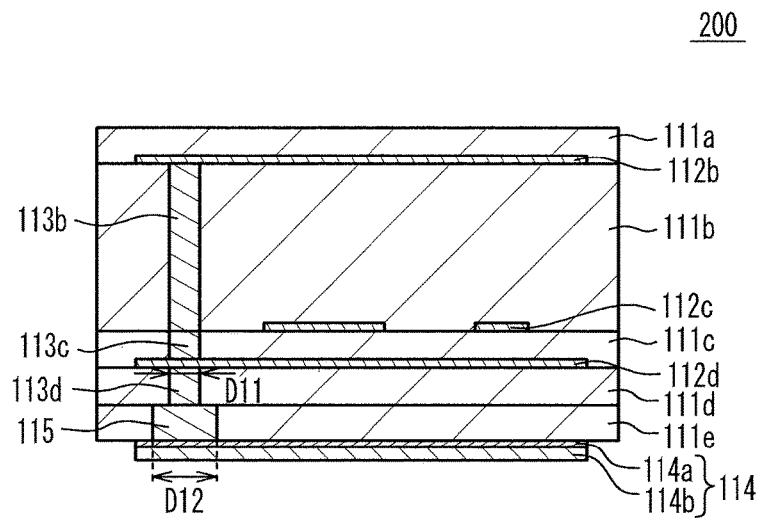
FIG. 16A and FIG. 16B are cross-sectional views of the electronic component in accordance with the second embodiment.
Figure 16B:
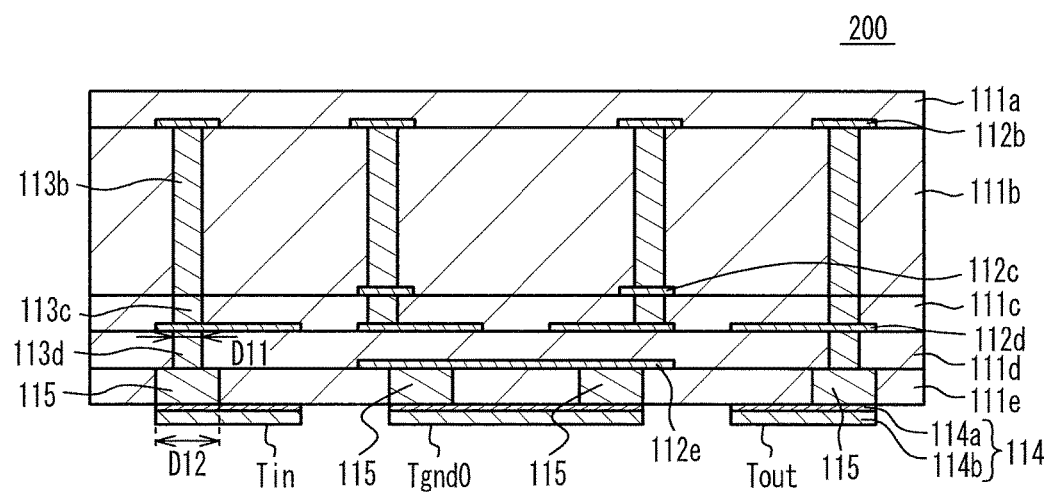

FIG. 15 is a perspective view of the electronic component in accordance with the second embodiment, and FIG. 16A and FIG. 16B are cross-sectional views. As illustrated in FIG. 15, an electronic component 200 includes a multilayered body 110. Terminals 114 are located on the lower surface of the multilayered body 110. The terminals 114 are, for example, the input terminal Tin, the output terminal Tout, and the ground terminal Tgnd0.

As illustrated in FIG. 16A and FIG. 16B, in the multilayered body 110, dielectric layers 111a through 111e made of ceramic materials are stacked. Conductor patterns 112b through 112e are located on the upper surfaces of the dielectric layers 111b through 111e, respectively. The terminals 114 are located on the lower surface of the dielectric layer 111e. The terminals 114 are, for example, LGAs, and are located only in the lower surface of the dielectric layer 111e. The terminal 114 includes a conductor layer 114a that is in contact with the lower surface of the dielectric layer 111e and a conductor layer 114b located under the conductor layer 114a. Via wirings 113b through 113d and 115 are provided so as to respectively penetrate through the dielectric layers 111b through 111e. The via wirings 113b through 113d and 115 have, for example, columnar shapes. The via wirings 113b through 113d are connected to at least one of the conductor patterns 112b through 112e. The via wiring 115 connects at least one of the conductor patterns 112b through 112e to the terminal 114. The diameter D12 of the via wiring 115 is greater than the diameters D11 of the via wirings 113b through 113d.

Figure 17:
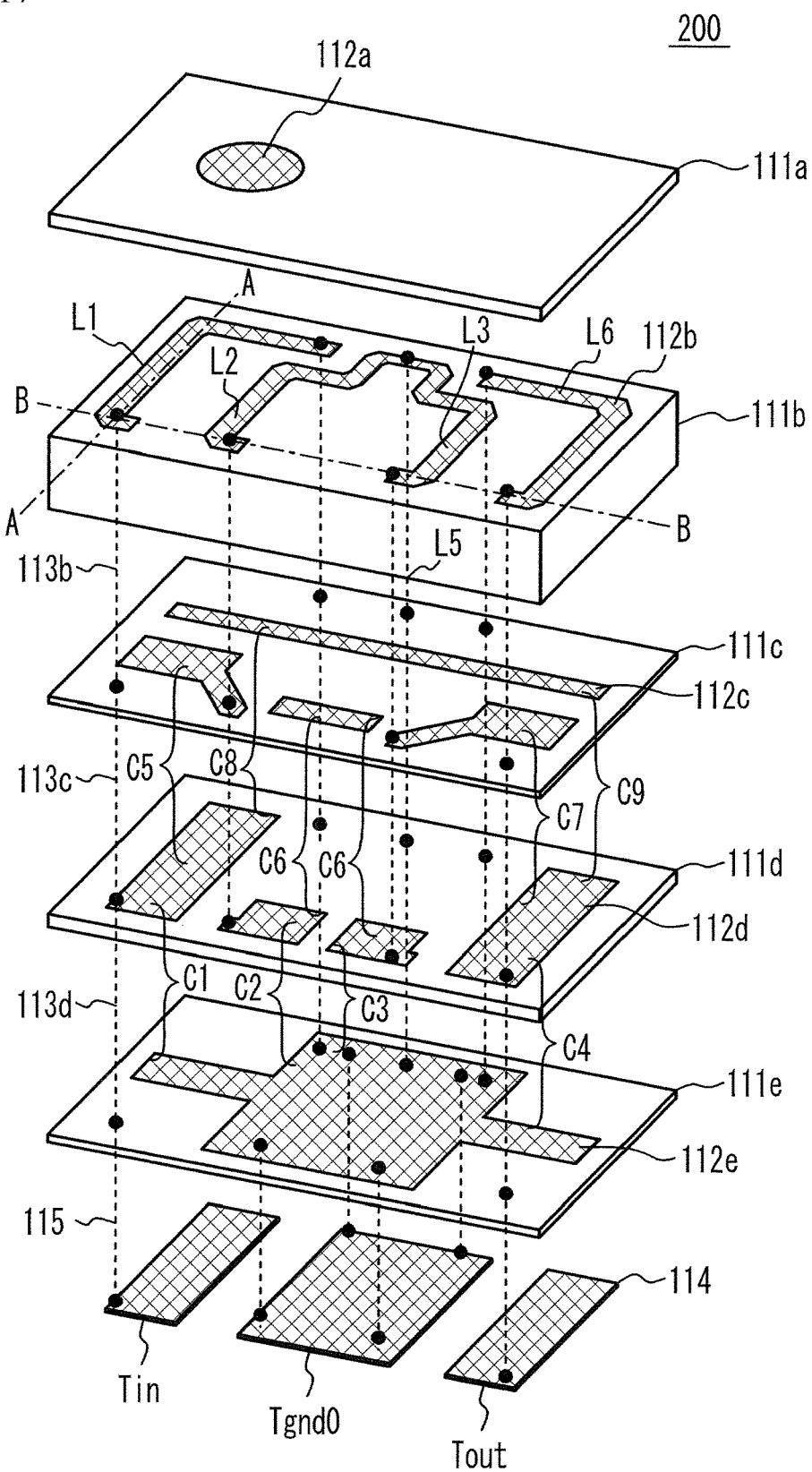
FIG. 17 is an exploded perspective view of the electronic component in accordance with the second embodiment.

FIG. 17 is an exploded perspective view of the electronic component in accordance with the second embodiment. FIG. 16A corresponds to the cross-section taken along line A-A in FIG. 17, and FIG. 16B corresponds to the cross-section taken along line B-B in FIG. 17. In FIG. 17, the connections of the via wirings 113b through 113d and 115 are indicated by dashed lines. As illustrated in FIG. 17, a conductor pattern 112a functions as an orientation identification mark. The striplines L1 through L3, L5, and L6 are formed of the conductor pattern 112b. The stripline L5 is formed of the via wirings 113b through 113d. The capacitors C5 through C9 are formed of the conductor patterns 112c and 112d sandwiching the dielectric layer 111c. The capacitors C1 through C4 are formed of the conductor patterns 112d and 112e sandwiching the dielectric layer 111d.

The dielectric layers 111a through 111e are made of ceramic materials, and contain an oxide of, for example, Si, Ca and Mg (for example, $CaMgSi_2O_e$, which is diopside crystal) as a main component. The main component of the dielectric layers 111a through 111e may be an oxide of other than Si, Ca and/or Mg. Furthermore, the dielectric layers 111a through 111e may contain an oxide of at least one of Ti, Zr, and Al as an insulator material.

The conductor patterns 112a through 112e, the via wirings 113b through 113d and 115, and the conductor layer 114a are formed of metal layers containing, for example, Ag, Pd, Pt, Cu, Ni, Au, Au—Pd alloy, or Ag—Pt alloy. The conductor layer 114a contains an insulator material in addition to the above metal material. The insulator material is, for example, titanium oxide, zirconium oxide, and/or aluminum oxide, and is the same material as at least one of the materials contained in, for example, the dielectric layers 111a through 111e. The conductor layer 114b is formed of, for example, a Ni film and a Sn film. The Sn film is a solder layer for mounting the electronic component 200 on a motherboard, and the Ni film is a barrier layer for reducing interdiffusion between the solder layer and the conductor layer 114a.

The multilayered body 110 is fabricated as follows, for example. The dielectric layers 111a through 111e are fabricated by, for example, doctor blading. The via wirings 113b through 113d and 115 penetrating through the dielectric layers 111b through 111e are formed. For example, via holes penetrating through the dielectric layers 111a through 111e are formed by laser beam irradiation. The via wirings 113b through 113d and 115 are formed in the via holes by squeegeeing. The conductor patterns 112a through 112e and the conductor layer 114a are formed on the surfaces of the dielectric layers 111a through 111e. The conductor patterns 112a through 112e and the conductor layer 114a are formed by, for example, screen printing or transfer printing. The multilayered body 110 is formed by stacking the dielectric layers 111a through 111e. The dielectric layers 111a through 111e are stacked by, for example, heating and pressurizing or an adhesive agent. The multilayered body 110 is baked at, for example, 700° C. or greater. This process makes the dielectric layers 111a through 111e a sintered compact. The conductor layer 114b is formed under the conductor layer 114a. The conductor layer 114b is formed by, for example, plating such as barrel plating.

As disclosed in Japanese Patent Application Publication No. 2009-170848, when the conductor layer 114a contains no insulator material, the bond strength between the conductor layer 114a and the dielectric layer 111e is low. Thus, when the multilayered body 110 is baked, the terminal 114 easily peels from the dielectric layer 111e. In addition, cracks are formed in the terminal 114 and/or the dielectric layer 111e. When the conductor layer 114a contains a metal material and an insulator material, peeling of the terminal 114 and/or the formation of cracks is inhibited. In particular, when the insulator material contained in the conductor layer 114a is the same as at least one of the materials contained in the dielectric layers 111a through 111e, the bond strength between the conductor layer 114a and the dielectric layer 111e is enhanced. The insulator material is preferably titanium oxide, zirconium oxide, and/or aluminum oxide.

Third Comparative Example

Figure 18A:
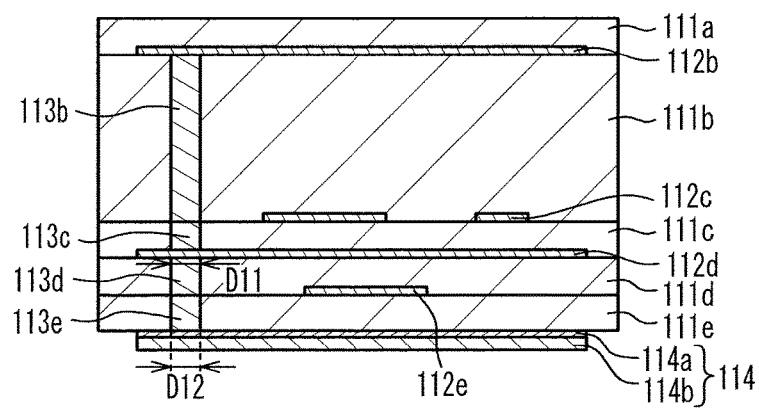
FIG. 18A and FIG. 18B are cross-sectional views of an electronic component in accordance with a third comparative example.
Figure 18B:
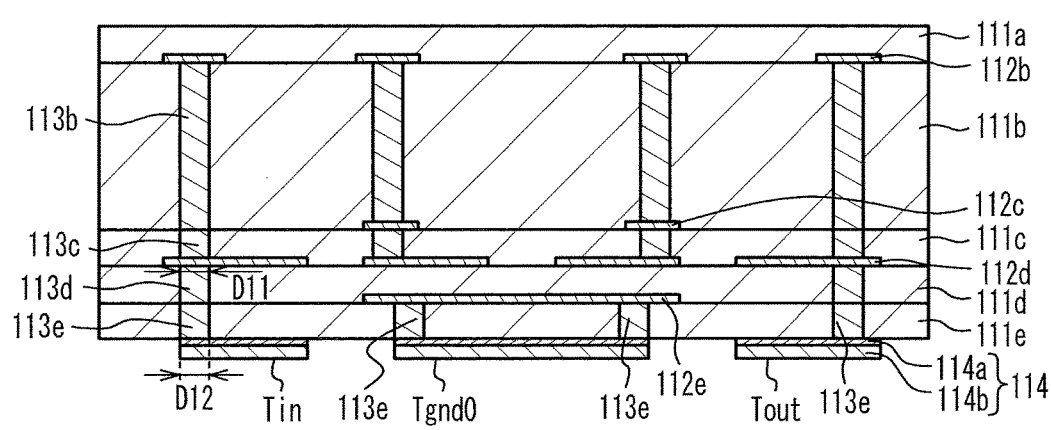

FIG. 18A and FIG. 18B are cross-sectional views of an electronic component in accordance with a third comparative example. As illustrated in FIG. 18A and FIG. 18B, in an electronic component 210, the diameter D12 of a via wiring 113e penetrating through the dielectric layer 111e is practically the same as the diameters D11 of the via wirings 113b through 113d. Other structures are the same as those of the second embodiment, and the description thereof is thus omitted.

In the third comparative example, since the conductor layer 114a contains an insulator material, the electrical bonding between the conductor layer 114a and the via wiring 113e is inhibited. Thus, the contact resistance value between the via wiring 113e and the terminal 114 increases. For example, in the case where a high power high frequency signal is input to the input terminal Tin, if the contact resistance between the via wiring 113e and the terminal 114 is high, heat is generated, and the vicinity of the bonding part between the via wiring 113e and the terminal 114 is thereby melted and cut. On the other hand, when the diameters of the via wirings 113b through 113e are increased, the electronic component becomes larger. As described above, it is difficult to reduce the size of the electronic component and reduce the contact resistance between the terminal 114 and the via wiring 113e.

Comparison Between the Second Embodiment and the Third Comparative Example

In the second embodiment, the area of contact between the via wiring 115 penetrating through the dielectric layer 111e and the conductor layer 114a is made to be larger than the diameters of other via wirings 113b through 113d. This configuration reduces the size of the electronic component, and reduces the contact resistance between the terminal 114 and the via wiring 113e.

In the second embodiment and the third comparative example, the resistance between the input terminal Tin and the output terminal Tout was measured. The resistance value with respect to D12/D11 was calculated with use of the measured resistance value. The resistance value was the resistance between the input terminal Tin and the output terminal Tout through the via wirings 113b through 113d and 115 and the stripline L1. Additionally, the lifetime of the electronic component when a high-frequency signal is input to the input terminal Tin was measured. The lifetime was defined as time until the electronic component is broken when the environmental temperature is 175° C. and a high power high frequency signal is applied to the input terminal Tin.

Conditions are as follows.

Figure 19:
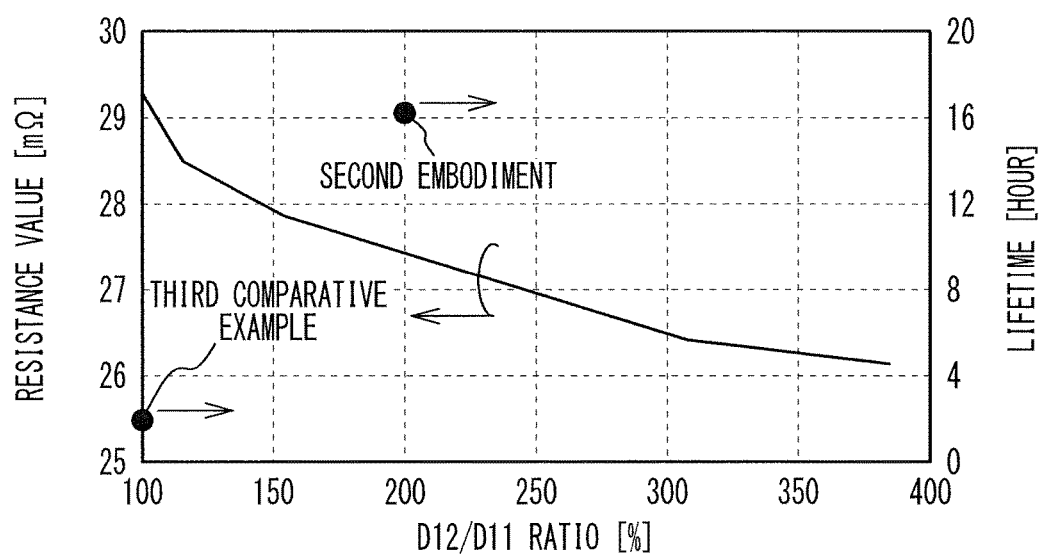
FIG. 19 is a graph of a resistance value and a lifetime versus D12/D11 in the second embodiment and the third comparative example.

Materials of the dielectric layers 111a through 111e: contain an oxide of Si, Ca, and Mg as a main component, and contain 3 weight percent (in terms of an oxide) of $TiO_2$ Thicknesses of the dielectric layers 111a through 111e: 30 μm, 400 μm, 10 μm, 10 μm, and 30 μm, respectively Material of the conductor pattern 112b: contains Ag as a main component, and contains 13 weight percent (in terms of an oxide) of $TiO_2$ Dimensions of the conductor pattern 112b of the stripline L1: length: 1400 μm, width: 100 μm, thickness: 20 μm Materials of the via wirings 113b through 113d and 115: contains Ag as a main component Diameters D11 of the via wirings 113b through 113d: 65 μm Diameter D12 of the via wiring 115 or 113e: second embodiment: 120 μm, third comparative example: 65 μm Material of the conductor layer 114a: contains Ag as a main component, and contains 13 weight percent (in terms of an oxide) of $TiO_2$ Thickness of the conductor layer 114a: 10 μm Frequency of the high-frequency signal: 3800 MHz Power of the high-frequency signal: 39.98 dBm FIG. 19 is a graph of a resistance value and a lifetime versus D12/D11 in the second embodiment and the third comparative example. In FIG. 19, a solid line indicates the calculated resistance value, and dots indicate measurement results of the lifetime. As illustrated in FIG. 19, as D12/D11 increases, the resistance value decreases. This is considered because the contact resistance between the conductor layer 114a and the via wiring 115 decreased. The lifetime of the third comparative example is approximately 2 hours, while the lifetime of the second embodiment is approximately 16 hours.

Figure 20:
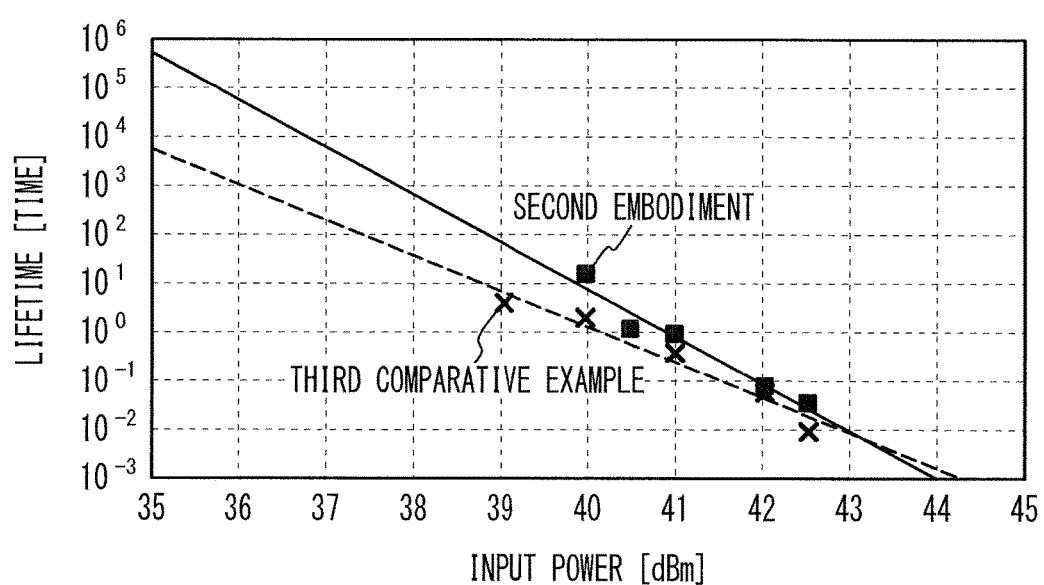
FIG. 20 is a graph of a lifetime versus input power in the second embodiment and the third comparative example.

FIG. 20 is a graph of a lifetime versus input power in the second embodiment and the third comparative example. Dots indicate measured points, and a straight line is an approximate line. As illustrated in FIG. 20, the lifetime of the second embodiment is longer than the lifetime of the third comparative example. When the input power is 35 dBm, which is a practical power, the lifetime of the second embodiment is two orders of magnitude longer than the lifetime of the third comparative example. As described above, by reducing the contact resistance between the conductor layer 114a and the via wiring 115, the lifetime when a high power high frequency signal is input to the input terminal Tin increases.

First Variation of the Second Embodiment

Figure 21A:
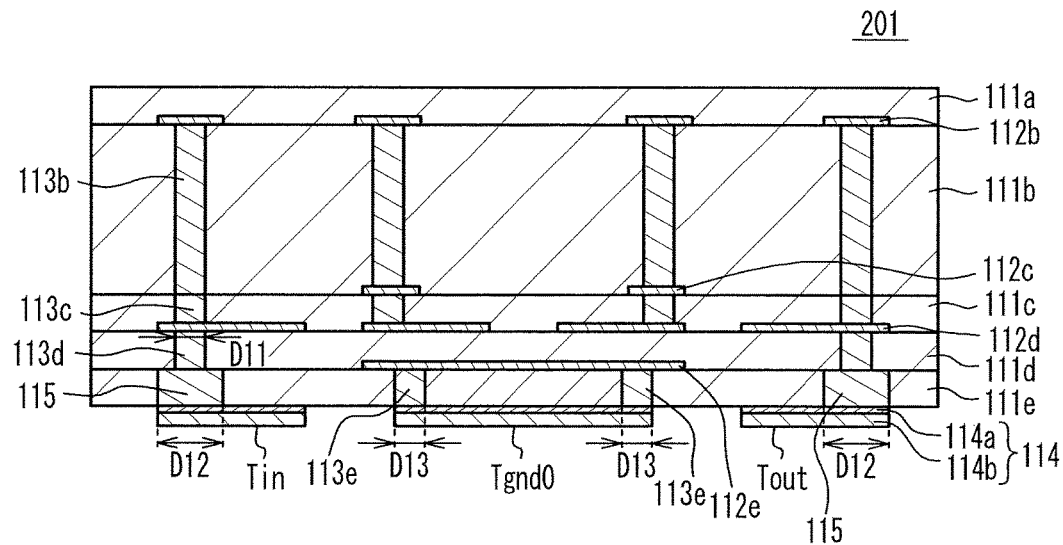
FIG. 21A and FIG. 21B are cross-sectional views of an electronic component in accordance with a first variation of the second embodiment.
Figure 21B:
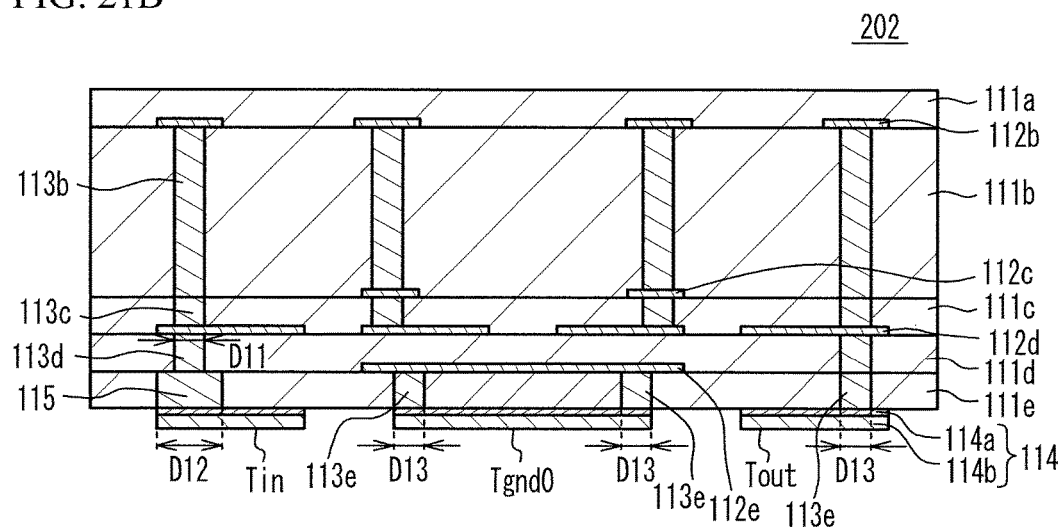

FIG. 21A and FIG. 21B are cross-sectional views of an electronic component in accordance with a first variation of the second embodiment. As illustrated in FIG. 21A, in an electronic component 201, the via wirings 115 are in contact with the input terminal Tin and the output terminal Tout, and the via wirings 113e are in contact with the ground terminal Tgnd0. The diameter D13 of the via wiring 113e is less than the diameter D12 of the via wiring 115, and is approximately equal to the diameters D11 of the via wirings 113b through 113d. The terminal through which a high-frequency signal passes is mainly required to have a reduced resistance. Thus, the diameters D12 of the via wirings 115, which are in contact with the input terminal Tin and the output terminal Tout, may be made to be greater than D11 and D13. Other structures are the same as those of the second embodiment, and the description thereof is thus omitted.

As illustrated in FIG. 21B, in an electronic component 202, the via wiring 115 is in contact with the input terminal Tin, and the via wirings 113e are in contact with the output terminal Tout and the ground terminal Tgnd0. The vicinity of the input terminal Tin is damaged by a high power high frequency signal. Thus, the diameter D12 of the via wiring 115, which is in contact with the input terminal Tin, may be made to be greater than the diameters D11 of the via wirings 113b through 113d and the diameters D13 of the via wirings 113e, which are in contact with the ground terminal Tgnd0 and the output terminal Tout. Other structures are the same as those of the second embodiment, and the description thereof is thus omitted.

Second Variation of the Second Embodiment

Figure 22:
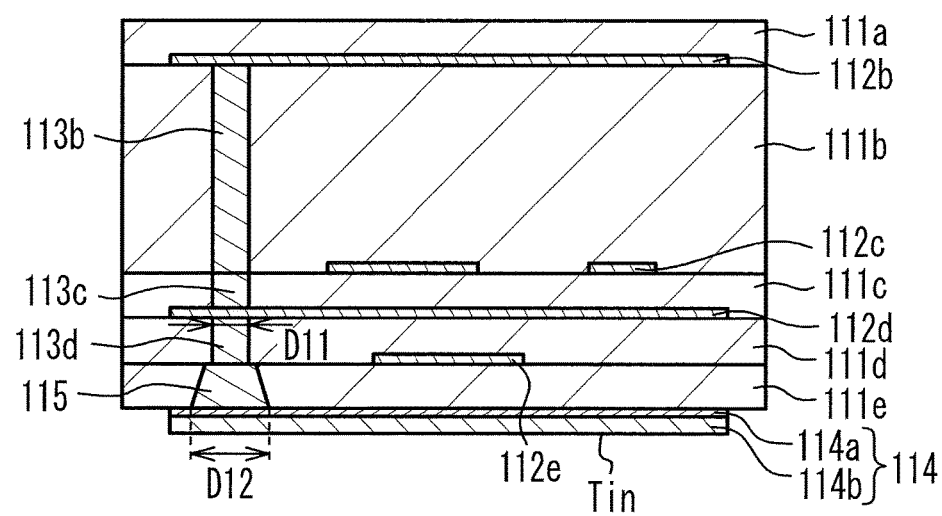
FIG. 22 is a cross-sectional view of an electronic component in accordance with a second variation of the second embodiment.

FIG. 22 is a cross-sectional view of an electronic component in accordance with a second variation of the second embodiment. As illustrated in FIG. 22, in an electronic component 203, the via wiring 115 has a truncated cone shape in which the diameter at the terminal 114 side is larger. As described above, as long as the area of contact between the conductor layer 114a and the via wiring 115 can be made to be large, the shape of the via wiring 115 can be freely selected.

In the second embodiment and the variations thereof, each of the conductor patterns 112b through 112e is formed on the surface of one of the dielectric layers 111b through 111e, and constitutes at least a part of a circuit element (for example, a capacitor and/or an inductor) provided in the multilayered body 110. One or more terminals 114 are located on the lower surface (the outer surface, i.e., the surface opposite from the surface being in contact with another dielectric layer 111d) of the dielectric layer 111e (the outermost dielectric layer, i.e., the dielectric layer located outermost in the stacking direction of the dielectric layers 111a through 111e), and include one or more conductor layers 114a and 114b. The conductor layer 114a that is in contact with the lower surface of the dielectric layer 111e contains a metal material and an insulator material. The via wirings 113b through 113d (a first via wiring) penetrate through at least one of the dielectric layers 111b through 111d except the dielectric layer 111e, and electrically connect between at least two conductor patterns of the conductor patterns 112b through 112e.

The via wiring 115 (a second via wiring) penetrates through the dielectric layer 111e, and electrically connects the terminal 114 to at least one of the conductor patterns 112b through 112e. A first area of contact between the via wiring 115 and the terminal 114 is greater than the cross-section areas of the via wirings 113b through 113d (the cross-section area in a plane parallel to the lower surface of the dielectric layer 111e).

This structure reduces the contact resistance between the terminal 114 and the via wiring 115. In addition, since the via wirings 113b through 113d can be made to be small, the size of the electronic component can be reduced.

It is sufficient if the via wiring 115 electrically connects at least one terminal 114 of one or more terminals 114 to at least one conductor pattern of a plurality of conductor patterns. This configuration reduces the contact resistance between the via wiring 115 and the terminal 114.

As in the second embodiment, the via wirings 115 may be connected to all the terminals 114. This configuration reduces the resistances between all the terminals 114 and circuit elements. The first area of contact between the via wiring 115 and the terminal 114 is preferably equal to or greater than 1.5 times, more preferably two times, further preferably four times the cross-section areas of the via wirings 113b through 113d.

As in the second embodiment and the first variation thereof, the terminals 114 with which the via wirings 115 are in contact include the input terminal Tin to which a high-frequency signal is input. This configuration inhibits the breakage of the electronic component.

When the cross-section areas of the via wirings 113b through 113d and the contact areas of the via wirings 115 vary, it is sufficient if the smallest contact area among the contact areas of the via wirings 115 that are in contact with the input terminal Tin is greater than the largest cross-section area among the cross-section areas of the via wirings 113b through 113d. The smallest contact area is preferably equal to or greater than 1.5 times, more preferably two times, further preferably four times the largest cross-section area.

As in the first variation of the second embodiment, the via wiring 113e (a third via wiring) penetrates through the dielectric layer 111e, and electrically connects the ground terminal Tgnd0 and at least one of the conductor patterns 112b through 112e. A second area of contact between the via wiring 113e and the ground terminal Tgnd0 is less than the first area of contact between the via wiring 115 and the input terminal Tin. The ground terminal Tgnd0 is the terminal 114 to which large power is hardly applied. Thus, the contact area of the via wiring 113e that is in contact with the ground terminal Tgnd0 is reduced. This configuration reduces the size of the electronic component.

The area of contact between the via wiring 113e and the terminal 114 is substantially the same as the cross-section areas of the via wirings 113b through 113d to the extent of production errors. It is sufficient if the smallest first area of contact among the first areas of contact between the via wirings 115 and the input terminal Tin is greater than the largest second area of contact among the second areas of contact between the via wirings 113e and the terminals 114 (the ground terminal Tgnd0 and/or the output terminal Tout). The smallest first area of contact is preferably equal to or greater than 1.5 times, more preferably two times, further preferably four times the largest second area of contact.

Third Embodiment

Figure 23A:
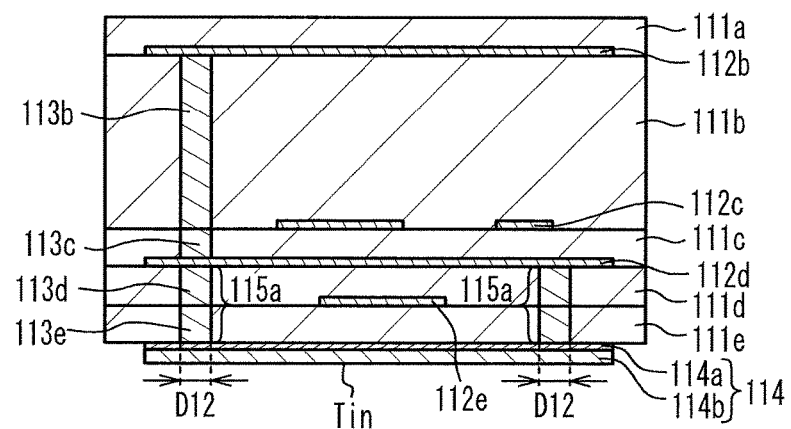
FIG. 23A and FIG. 23B are cross-sectional views of an electronic component in accordance with a third embodiment.
Figure 23B:
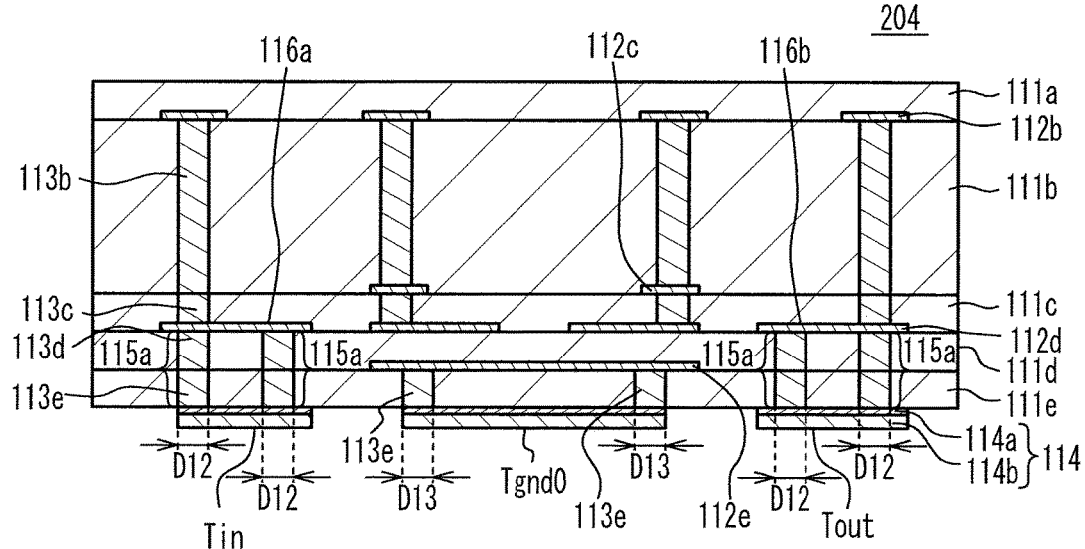

FIG. 23A and FIG. 23B are cross-sectional views of an electronic component in accordance with a third embodiment. As illustrated in FIG. 23A and FIG. 23B, in an electronic component 204, the diameters D12 of the via wirings 113e, which penetrate through the dielectric layer 111e and connect to the input terminal Tin and the output terminal Tout, are substantially the same as the diameters D11 of the via wirings 113b through 113d to the extent of production errors. Additionally, the diameter D12 is substantially the same as the diameter D13 of the via wiring 113e that penetrates through the dielectric layer 111e and connects to the ground terminal Tgnd0 to the extent of production errors.

Via wirings 115a (the via wirings formed of the via wirings 113d and 113e connected to each other) electrically connect the input terminal Tin to an electrode 116a of the capacitor C5 formed of the conductor pattern 112d. The via wirings 115a electrically connect the output terminal Tout to an electrode 116b of the capacitor C7 formed of the conductor pattern 112d. The via wirings 115a are connected to the vicinities of four corners of the rectangle of each of the input terminal Tin and the output terminal Tout of which planer shapes are, for example, rectangles. Other structures are the same as those of the second embodiment, and the description thereof is thus omitted.

In the third embodiment, the via wiring 115a connecting the input terminal Tin to the electrode 116a is provided in a plurality. The via wiring 115a connecting the output terminal Tout to the electrode 116b is provided in a plurality. This configuration reduces the contact resistances between the via wirings 115a and the input terminal Tin and the output terminal Tout compared to the third comparative example. Thus, even when a high power high frequency signal is input to the input terminal Tin, the vicinity of the input terminal Tin is inhibited from being broken.

First Variation of the Third Embodiment

Figure 24:
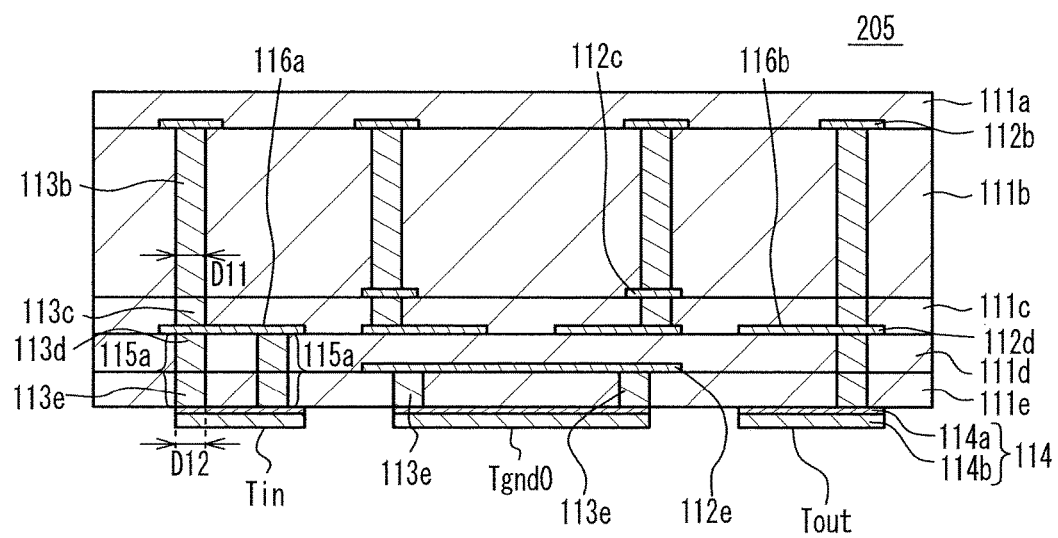
FIG. 24 is a cross-sectional view of an electronic component in accordance with a first variation of the third embodiment.

FIG. 24 is a cross-sectional view of an electronic component in accordance with a first variation of the third embodiment. As illustrated in FIG. 24, in an electronic component 205, the number of the via wiring 113e coupled to the output terminal Tout is one. Other structures are the same as those of the second embodiment, and the description thereof is thus omitted. As in the first variation of the third embodiment, the number of the via wirings 113e connecting to the output terminal Tout may be less than the number of the via wirings 113e connected to the input terminal Tin.

In the third embodiment and the variation thereof, the via wirings 113e penetrate through the dielectric layer 111e, and are connected in parallel to each other between the input terminal Tin and one conductor pattern 112d (the electrode 116a), which forms a capacitor among the conductor patterns 112b through 112e. As described above, the via wirings 113e may be connected to the input terminal Tin.

The first area of contact between each of the via wirings 115a and the input terminal Tin is substantially the same as the cross-section areas of the via wirings 113b through 113d to the extent of production errors. This configuration makes the diameter of the via wiring 115a approximately equal to the diameters of the via wirings 113b through 113d. Thus, the fabrication process is simplified. Additionally, the size of the electronic component is reduced.

The second area of contact between the via wiring 113e, which electrically connects the ground terminal Tgnd0 to at least one of the conductor patterns 112b through 112e, and the ground terminal Tgnd0 is approximately equal to the first area of contact between the via wiring 115a and the input terminal Tin to the extent of production errors. Thus, the diameter of the via wiring 115a can be made to be approximately equal to the diameter of the via wiring 113e. Thus, the fabrication process is simplified. Additionally, the size of the electronic component is reduced.

In the second and third embodiments and the variations thereof, the insulator material contained in the conductor layer 114a contains the same material as the material contained in the dielectric layer 111e. This enhances the bond strength between the terminal 114 and the dielectric layer 111e.

The insulator material contained in the conductor layer 114a is preferably at least one of titanium oxide, zirconium oxide, and aluminum oxide. This configuration further enhances the bond strength between the terminal 114 and the dielectric layer 111e.

Each of the dielectric layers 111a through 111e preferably contains 0.1 weight percent or greater and 50 weight percent or less in terms of an oxide of an insulator material, more preferably 1 weight percent or greater and 10 weight percent or less in terms of an oxide of an insulator material. The conductor layer 114a preferably contains 0.1 weight percent or greater and 66 weight percent or less in terms of an oxide of an insulator material, more preferably 1 weight percent or greater and 20 weight percent or less in terms of an oxide of an insulator material.

The conductor layer 114b may contain the same metal material as, for example, the conductor layer 114a. In this case, the conductor layer 114b contains no insulator material, or the concentration of the insulator material of the conductor layer 114b is less than the concentration of the insulator material of the conductor layer 114a. This configuration makes the resistance of the terminal 114 small.

In addition, the conductor layer 114b may contain a solder layer as with the Ni film and the Sn film.

An example in which five dielectric layers 111a through 111e are provided has been described, but the number of the dielectric layers 111a through 111e can be freely selected. The capacitor and the stripline (or the inductor) have been described as examples of the circuit elements included in the multilayered body 110, but the circuit elements may be only capacitors or only inductors. A bandpass filter has been described as an example of the electronic component, but the electronic component may be a filter such as a high-pass filter or a low-pass filter. The electronic component may be a multiplexer such as a diplexer, a duplexer, a triplexer, or a quadplexer.

Fourth Embodiment

Figure 25:
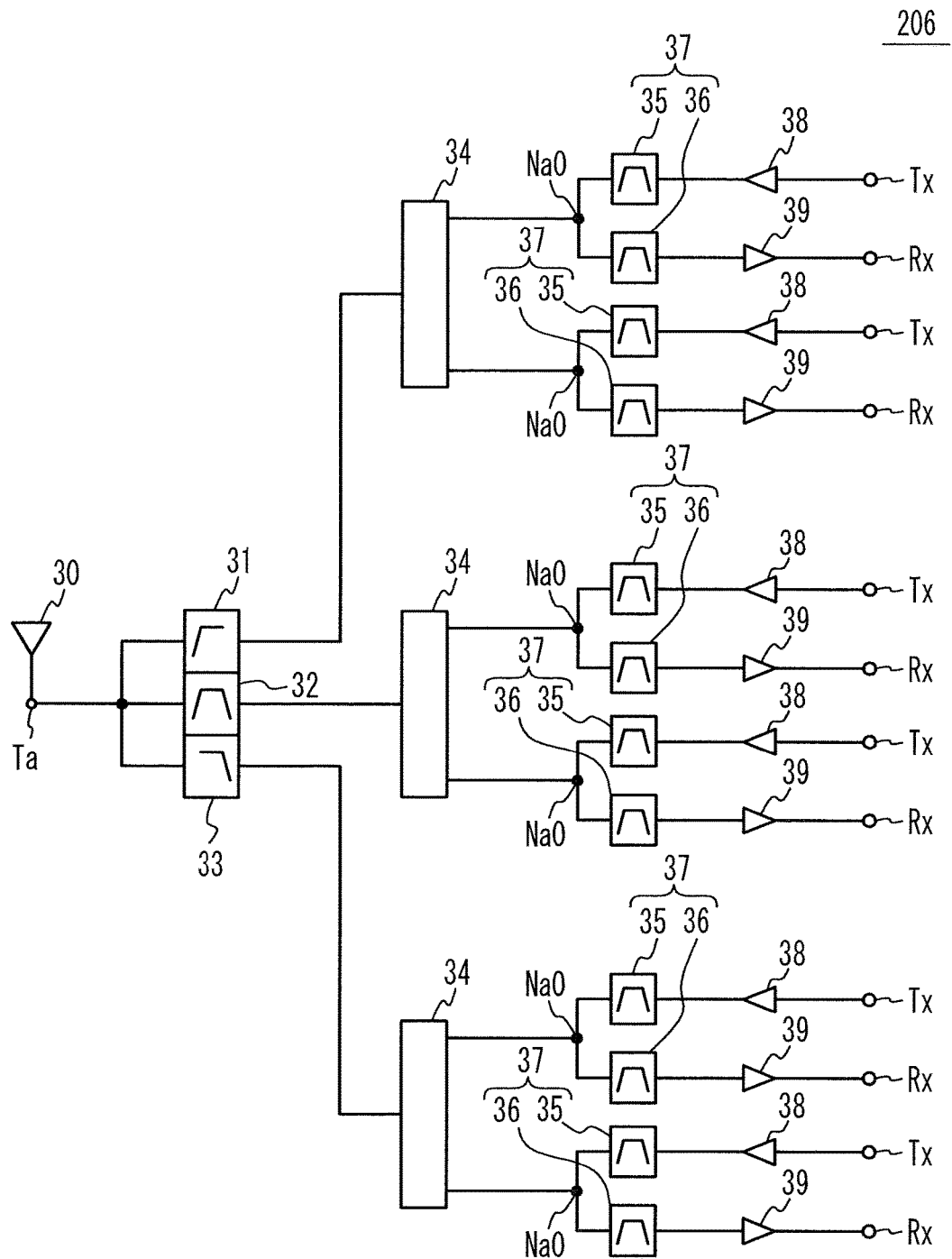
FIG. 25 is a circuit diagram of a front end circuit in accordance with a fourth embodiment.

A fourth embodiment is an exemplary circuit to which the second and third embodiments and the variations thereof are applied. FIG. 25 is a circuit diagram of a front end circuit in accordance with a fourth embodiment. As illustrated in FIG. 25, a front end circuit 206 includes a high-pass filter (HPF) 31, a bandpass filter (BPF) 32, a low-pass filter (LPF) 33, switches 34, duplexers 37, power amplifiers (PAs) 38, and low noise amplifiers (LNAs) 39.

An antenna 30 is coupled to an antenna terminal Ta. First ends of the HPF 31, the BPF 32, and the LPF 33 are commonly connected to the antenna terminal Ta. The switch 34 is coupled to each of second ends of the HPF 31, the BPF 32, and the LPF 33. The HPF 31 allows high-frequency signals in a high band to pass therethrough, and suppresses signals with other frequencies. The BPF 32 allows high-frequency signals in a middle band, of which the frequency is lower than that of the high band, to pass therethrough, and suppresses signals with other frequencies. The LPF 33 allows high-frequency signals in a low band, of which the frequency is lower than that of the middle band, to pass therethrough, and suppresses signals with other frequencies.

Common terminals Na0 of the duplexers 37 are coupled to the switch 34. The switches 34 select one duplexer 37 from the duplexers 37, and connect the selected duplexers 37 to the second ends of the HPF 31, the BPF 32, and the LPF 33. The duplexer 37 includes a transmit filter 35, which is a BPF, and a receive filter 36, which is a BPF. The transmit filter 35 is coupled to the PA 38, and the receive filter 36 is coupled to the LNA 39.

The transmission signal input to the transmit terminal Tx is amplified by the PA 38. The transmit filter 35 outputs high-frequency signals in the transmit band to the common terminal Na0 among amplified signals, and suppresses signals with other frequencies. The filtered-out transmission signal passes through the switch 34 and the HPF 31, the BPF 32, or the LPF 33, and is output from the antenna 30.

The reception signal input to the antenna 30 passes through the HPF 31, the BPF 32, or the LPF 33 and the switch 34. The receive filter 36 allows signals in the receive band to pass therethrough among high-frequency signals input to the common terminal Na0, and suppresses signals with other frequencies. The filtered-out reception signal is amplified by the LNA 39, and is output to the receive terminal Rx.

The second and third embodiments and the variations thereof are applied to at least one of, for example, the BPF 32, the transmit filter 35, and the receive filter 36. In particular, a high power high frequency signal of 30 dBm or greater is applied to the transmit filter 35 of the BPF 32. Thus, the second and third embodiments and the variations thereof are applied to a filter of which the input terminal Tin is coupled to an output of the power amplifier and the output terminal Tout is coupled to the antenna 30. This configuration inhibits the electronic component from being broken by a high power high frequency signal or inhibits the lifetime from becoming shorter.

Although the embodiments of the present invention have been described in detail, it is to be understood that the various change, substitutions, and alterations could be made hereto without departing from the spirit and scope of the invention.

What is claimed is:

1. A multiplexer comprising:
  a low-pass filter that is connected between a common terminal and a first terminal and is formed of one or more first inductors and one or more first capacitors;
  a bandpass filter that is connected between the common terminal and a second terminal, has a passband higher than a passband of the low-pass filter, and is formed of one or more second inductors and one or more second capacitors;
  a high-pass filter that is connected between the common terminal and a third terminal, has a passband higher than the passband of the bandpass filter, and is formed of one or more third inductors and one or more third capacitors; and
  a fourth inductor that has a first end coupled to the common terminal and a second end coupled to the high-pass filter,
  wherein the low-pass filter is coupled to the common terminal without the fourth inductor, and the bandpass filter is coupled to the common terminal without the fourth inductor.

2. The multiplexer according to claim 1, wherein the one or more third capacitors include a fourth capacitor that is coupled to the fourth inductor without remaining elements of the high-pass filter and is connected in series between the common terminal and the third terminal.

3. The multiplexer according to claim 2, wherein the one or more third inductors include a fifth inductor that is coupled to the fourth capacitor without remaining elements of the high-pass filter and is shunt-connected between the common terminal and the third terminal, and
the one or more third capacitors include a fifth capacitor that is connected to the fourth capacitor and the fifth inductor without remaining elements of the high-pass filter and is connected in series between the common terminal and the third terminal.

4. The multiplexer according to claim 3, wherein a capacitance of the fourth capacitor is equal to or less than a half of a capacitance of the fifth capacitor.

5. The multiplexer according to claim 2, wherein the one or more first inductors include a sixth inductor that is connected to the common terminal without remaining elements of the low-pass filter and is connected in series between the common terminal and the first terminal, and
the one or more second capacitors include a sixth capacitor that is connected to the common terminal without remaining elements of the bandpass filter and is connected in series between the common terminal and the second terminal.

6. The multiplexer according to claim 1, further comprising
  dielectric layers that are stacked;
  conductor patterns each being formed on a surface of one of the dielectric layers; and
  via wirings each penetrating through at least one of the dielectric layers and electrically connecting to at least one of the conductor patterns, wherein
  each of the one or more first inductors, the one or more first capacitors, the one or more second inductors, the one or more second capacitors, the one or more third inductors, the one or more third capacitors, and the fourth inductor includes at least a part of at least one of the conductor patterns.

7. The multiplexer according to claim 6, wherein a length of a conductor pattern electrically connecting the fourth inductor and the common terminal is less than a length of a conductor pattern electrically connecting the low-pass filter and the common terminal and a length of a conductor pattern electrically connecting the bandpass filter and the common terminal.

8. The multiplexer according to claim 7, wherein the fourth inductor includes at least two conductor patterns located on respective surfaces of at least two dielectric layers, and the at least two conductor patterns at least partly overlap with each other in a stacking direction of the dielectric layers to form a spiral pattern.

9. A multiplexer comprising:
a low-pass filter that is connected between a common terminal and a first terminal and is formed of one or more first inductors and one or more first capacitors;
a bandpass filter that is connected between the common terminal and a second terminal, has a passband higher than a passband of the low-pass filter, and is formed of one or more second inductors and one or more second capacitors;
a high-pass filter that is connected between the common terminal and a third terminal, has a passband higher than the passband of the bandpass filter, and is formed of one or more third inductors and one or more third capacitors; and
a fourth inductor that has a first end coupled to the common terminal and a second end coupled to the high-pass filter,
wherein
the one or more third capacitors include a fourth capacitor that is coupled to the fourth inductor without remaining elements of the high-pass filter and is connected in series between the common terminal and the third terminal,
the one or more third inductors include a fifth inductor that is coupled to the fourth capacitor without remaining elements of the high-pass filter and is shunt-connected between the common terminal and the third terminal, and
the one or more third capacitors include a fifth capacitor that is connected to the fourth capacitor and the fifth inductor without remaining elements of the high-pass filter and is connected in series between the common terminal and the third terminal.

10. A multiplexer comprising:
a low-pass filter that is connected between a common terminal and a first terminal and is formed of one or more first inductors and one or more first capacitors;
a bandpass filter that is connected between the common terminal and a second terminal, has a passband higher than a passband of the low-pass filter, and is formed of one or more second inductors and one or more second capacitors;
a high-pass filter that is connected between the common terminal and a third terminal, has a passband higher than the passband of the bandpass filter, and is formed of one or more third inductors and one or more third capacitors; and
a fourth inductor that has a first end coupled to the common terminal and a second end coupled to the high-pass filter,
wherein
the one or more third capacitors include a fourth capacitor that is coupled to the fourth inductor without remaining elements of the high-pass filter and is connected in series between the common terminal and the third terminal,
the one or more first inductors include a fifth inductor that is connected to the common terminal without remaining elements of the low-pass filter and is connected in series between the common terminal and the first terminal, and
the one or more second capacitors include a fifth capacitor that is connected to the common terminal without remaining elements of the bandpass filter and is connected in series between the common terminal and the second terminal.

11. A multiplexer comprising:
a low-pass filter that is connected between a common terminal and a first terminal and is formed of one or more first inductors and one or more first capacitors;
a bandpass filter that is connected between the common terminal and a second terminal, has a passband higher than a passband of the low-pass filter, and is formed of one or more second inductors and one or more second capacitors;
a high-pass filter that is connected between the common terminal and a third terminal, has a passband higher than the passband of the bandpass filter, and is formed of one or more third inductors and one or more third capacitors;
a fourth inductor that has a first end coupled to the common terminal and a second end coupled to the high-pass filter;
dielectric layers that are stacked;
conductor patterns each being formed on a surface of one of the dielectric layers; and
via wirings each penetrating through at least one of the dielectric layers and electrically connecting to at least one of the conductor patterns, wherein
each of the one or more first inductors, the one or more first capacitors, the one or more second inductors, the one or more second capacitors, the one or more third inductors, the one or more third capacitors, and the fourth inductor includes at least a part of at least one of the conductor patterns.

\* \* \* \* \*